(12) United States Patent
Nowatari et al.

(10) Patent No.: US 9,917,259 B2
(45) Date of Patent: *Mar. 13, 2018

(54) LIGHT-EMITTING ELEMENT, LIGHT-EMITTING DEVICE, LIGHTING DEVICE, AND ELECTRONIC DEVICE

(71) Applicant: Semiconductor Energy Laboratory Co., Ltd., Kanagawa-ken (JP)

(72) Inventors: Hiromi Nowatari, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 170 days.

This patent is subject to a terminal disclaimer.

(21) Appl. No.: 14/811,525

(22) Filed: Jul. 28, 2015

(65) Prior Publication Data

US 2015/0333270 A1 Nov. 19, 2015

Related U.S. Application Data

(63) Continuation of application No. 12/874,392, filed on Sep. 2, 2010, now Pat. No. 9,099,682.

(30) Foreign Application Priority Data

Sep. 7, 2009 (JP) .................................. 2009-206431

(51) Int. Cl.
*H01L 51/00* (2006.01)
*H01L 51/52* (2006.01)
(Continued)

(52) U.S. Cl.
CPC ...... *H01L 51/0067* (2013.01); *H01L 51/0032* (2013.01); *H01L 51/5278* (2013.01);
(Continued)

(58) Field of Classification Search
CPC .............. H01L 27/3209; H01L 51/001; H01L 51/0053; H01L 51/006; H01L 51/0081; H01L 51/5278
See application file for complete search history.

(56) References Cited

U.S. PATENT DOCUMENTS 6,013,384 A 1/2000 Kido et al.
6,420,056 B1 7/2002 Chondroudis et al.
(Continued)

FOREIGN PATENT DOCUMENTS

EP 0 855 848 A2 7/1998
EP 1 615 472 A1 1/2006
(Continued)

OTHER PUBLICATIONS

Taiwanese Office Action re Application No. TW 099129680, dated Feb. 24, 2016.
(Continued)

*Primary Examiner* — Dawn L Garrett
(74) *Attorney, Agent, or Firm* — Husch Blackwell LLP

(57) ABSTRACT

A light-emitting element is provided, in which n (n is a natural number of two or more) EL layers are provided between an anode and a cathode. Between the m-th (m is a natural number, $1 \leq m \leq n-1$) EL layer and the (m+1)-th EL layer, a first layer containing any of an alkali metal, an alkaline earth metal, a rare earth metal, an alkali metal compound, an alkaline earth metal compound, and a rare earth metal compound, a second layer containing a substance having high electron-transport properties in contact with the first layer, and a charge-generation layer containing a substance having high hole-transport properties and an acceptor substance in contact with the second layer are (Continued)

provided in this order over the anode. The charge-generation layer does not have a peak of an absorption spectrum in a visible light region.

15 Claims, 15 Drawing Sheets

(51) Int. Cl.
H01L 51/50 (2006.01)
H01L 27/32 (2006.01)

(52) U.S. Cl.
CPC ........ H01L 27/3209 (2013.01); H01L 51/001 (2013.01); H01L 51/006 (2013.01); H01L 51/0053 (2013.01); H01L 51/0081 (2013.01); H01L 51/5004 (2013.01); H01L 51/504 (2013.01); H01L 51/5056 (2013.01); H01L 51/5072 (2013.01); H01L 51/5206 (2013.01); H01L 51/5221 (2013.01)

(56) References Cited

U.S. PATENT DOCUMENTS

| | | | |
|---|---|---|---|
| 6,566,807 B1* | 5/2003 | Fujita | H01L 51/5012 313/504 |
| 7,420,203 B2 | 9/2008 | Tsutsui et al. | |
| 7,473,923 B2 | 1/2009 | Tsutsui et al. | |
| 7,494,722 B2 | 2/2009 | Liao et al. | |
| 7,528,418 B2 | 5/2009 | Yamazaki et al. | |
| 7,649,197 B2 | 1/2010 | Iwaki et al. | |
| 7,728,517 B2 | 6/2010 | Aziz et al. | |
| 7,732,808 B2 | 6/2010 | Ikeda et al. | |
| 7,956,349 B2 | 6/2011 | Tsutsui et al. | |
| 7,956,353 B2 | 6/2011 | Tsutsui et al. | |
| 7,985,974 B2 | 7/2011 | Nowatari et al. | |
| 8,021,574 B2 | 9/2011 | Kawamura et al. | |
| 8,025,815 B2 | 9/2011 | Kawamura et al. | |
| 8,034,256 B2 | 10/2011 | Kawamura et al. | |
| 8,154,195 B2 | 4/2012 | Nishimura et al. | |
| 8,158,991 B2 | 4/2012 | Nowatari et al. | |
| 8,207,540 B2 | 6/2012 | Nowatari et al. | |
| 8,211,552 B2 | 7/2012 | Nishimura et al. | |
| 8,330,350 B2 | 12/2012 | Nishimura et al. | |
| 8,420,227 B2 | 4/2013 | Iwaki et al. | |
| 8,431,940 B2* | 4/2013 | Nowatari | H01L 51/5016 257/87 |
| 8,502,202 B2* | 8/2013 | Nowatari | B82Y 10/00 257/40 |
| 8,581,266 B2 | 11/2013 | Nowatari et al. | |
| 8,586,197 B2 | 11/2013 | Yamazaki et al. | |
| 8,952,394 B2 | 2/2015 | Nowatari et al. | |
| 9,099,682 B2* | 8/2015 | Nowatari | H01L 51/5278 |
| 2003/0189401 A1 | 10/2003 | Kido et al. | |
| 2003/0209974 A1 | 11/2003 | Yamazaki | |
| 2004/0183066 A1* | 9/2004 | Klubek | H01L 51/0058 257/40 |
| 2005/0174044 A1 | 8/2005 | Miura | |
| 2006/0188745 A1 | 8/2006 | Liao et al. | |
| 2006/0220534 A1 | 10/2006 | Shibanuma et al. | |
| 2006/0292394 A1 | 12/2006 | Iwaki et al. | |
| 2007/0120136 A1 | 5/2007 | Noda et al. | |
| 2007/0182317 A1 | 8/2007 | Kido et al. | |
| 2007/0200112 A1 | 8/2007 | Yamazaki et al. | |
| 2008/0136325 A1 | 6/2008 | Yamazaki et al. | |
| 2009/0078317 A1 | 3/2009 | Kim et al. | |
| 2009/0104721 A1 | 4/2009 | Hirakata et al. | |
| 2009/0167168 A1 | 7/2009 | Seo et al. | |
| 2010/0133573 A1 | 6/2010 | Nowatari et al. | |
| 2010/0301316 A1 | 12/2010 | Nowatari et al. | |
| 2010/0301317 A1 | 12/2010 | Nowatari et al. | |
| 2011/0215307 A1 | 9/2011 | Nowatari et al. | |
| 2011/0227119 A1 | 9/2011 | Tsutsui et al. | |
| 2011/0227125 A1 | 9/2011 | Tsutsui et al. | |
| 2011/0233530 A1 | 9/2011 | Nowatari et al. | |
| 2011/0240971 A1 | 10/2011 | Nowatari et al. | |
| 2011/0240972 A1 | 10/2011 | Nowatari et al. | |
| 2011/0260156 A1 | 10/2011 | Nowatari et al. | |
| 2011/0315968 A1 | 12/2011 | Nowatari et al. | |
| 2012/0168738 A1 | 7/2012 | Nowatari et al. | |
| 2012/0235166 A1 | 9/2012 | Nowatari et al. | |
| 2013/0228766 A1 | 9/2013 | Nowatari et al. | |
| 2014/0070198 A1 | 3/2014 | Nowatari et al. | |

FOREIGN PATENT DOCUMENTS

| | | |
|---|---|---|
| EP | 1 826 838 A2 | 8/2007 |
| EP | 2 034 001 A2 | 3/2009 |
| EP | 2 075 860 A2 | 7/2009 |
| EP | 2 192 633 A2 | 6/2010 |
| EP | 2 423 994 A1 | 2/2012 |
| JP | 10-270171 A | 10/1998 |
| JP | 2003-272860 A | 9/2003 |
| JP | 2004-311419 A | 11/2004 |
| JP | 2006-332048 A | 12/2006 |
| JP | 2006-351398 A | 12/2006 |
| JP | 2007-043062 A | 2/2007 |
| JP | 2007-258163 A | 10/2007 |
| JP | 2008-021665 A | 1/2008 |
| JP | 2008-532229 | 8/2008 |
| JP | 2009-016184 A | 1/2009 |
| JP | 2009-177157 A | 8/2009 |
| TW | 200918641 | 5/2009 |
| TW | 200932930 | 8/2009 |
| WO | WO 2006/091560 A1 | 8/2006 |
| WO | WO 2006/093171 A1 | 9/2006 |
| WO | WO 2009/008347 A1 | 1/2009 |

OTHER PUBLICATIONS

International Search Report re Application No. PCT/JP2010/063671, dated Nov. 9, 2010.
Written Opinion re Application No. PCT/JP2010/063671, dated Nov. 9, 2010.
Nowatari, H. et al., "60.2: Intermediate Connector With Suppressed Voltage Loss for White Tandem OLEDs," SID Digest '09: SID International Symposium Digest of Technical Papers, May 31, 2009, vol. 40, pp. 899-902.
Ikeda, H. et al., "P-185: Low-Drive-Voltage OLEDs With a Buffer Layer Having Molybdenum Oxide," SID Digest '06: SID International Symposium Digest of Technical Papers, 2006, vol. 37, pp. 923-926.
European Search Report re Application No. EP 10813608.6, dated Jan. 4, 2016.

* cited by examiner

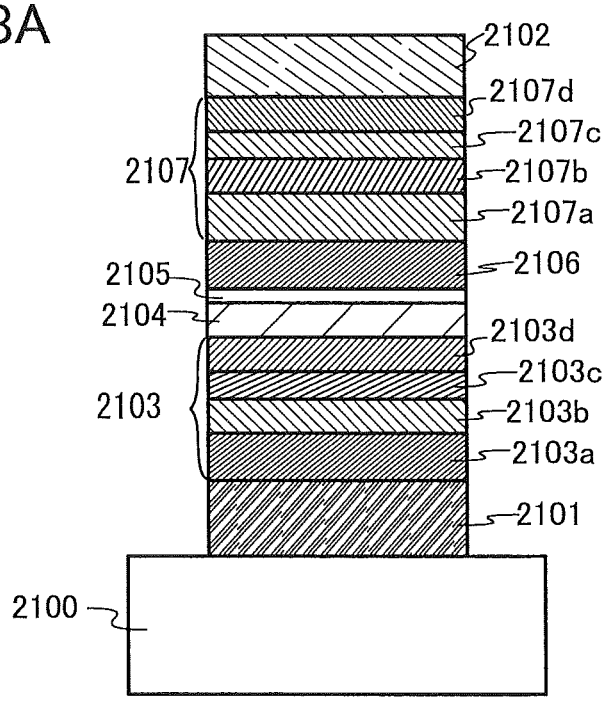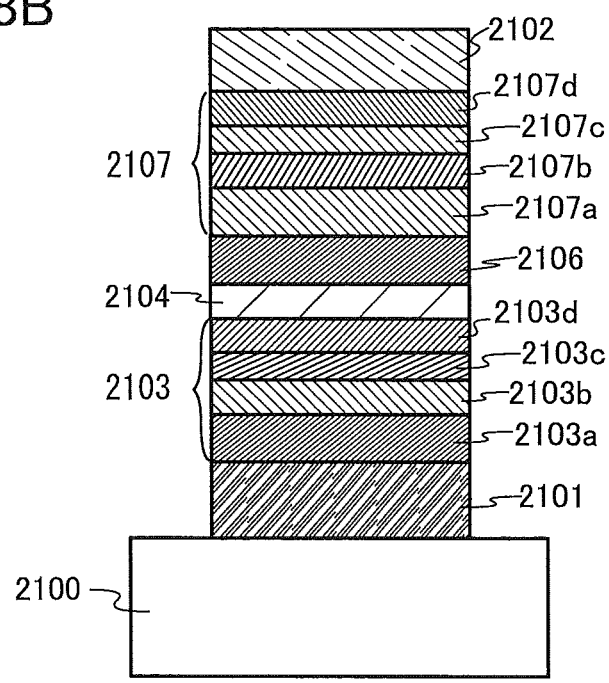

LIGHT-EMITTING ELEMENT, LIGHT-EMITTING DEVICE, LIGHTING DEVICE, AND ELECTRONIC DEVICE

This application is a continuation of copending U.S. application Ser. No. 12/874,392, filed on Sep. 2, 2010 which is incorporated herein by reference.

TECHNICAL FIELD

The present invention hereinafter disclosed relates to a light-emitting element including a light-emitting layer between a pair of electrodes. The present invention also relates to a light-emitting device in which the light-emitting element is used and a lighting device and an electronic device in each of which the light-emitting device is used.

BACKGROUND ART

In recent years, a light-emitting element in which a light-emitting organic compound or a light-emitting inorganic compound is used as a light-emitting substance has been actively developed. In particular, a light-emitting element called an electroluminescence (hereinafter, EL) element has a simple structure in which a light-emitting layer containing a light-emitting substance is provided between electrodes, and has attracted attention as a next-generation flat panel display element because of its characteristics such as thinness, lightweight, high response speed, and direct current low voltage driving. In addition, a display in which such a light-emitting element is used has a feature in that it is excellent in contrast and image quality and has a wide viewing angle. Moreover, such a light-emitting element is a plane light source; therefore, such a light-emitting element is considered to be applied as a light source such as a backlight of a liquid crystal display and lighting.

Current is applied to a light-emitting layer provided between a pair of electrodes in a light-emitting element to excite a light-emitting substance contained in the light-emitting layer, whereby a predetermined emission color can be obtained. Supplying a large amount of current to the light-emitting layer is considered in order to increase emission luminance of such a light-emitting element; however, such a method hinders a reduction in power consumption. In addition, applying a large amount of current also leads to acceleration of deterioration of the light-emitting element.

Hence, a light-emitting element is proposed whose emission luminance is increased by stacking a plurality of light-emitting layers and applying current which has the same current density as current applied in the case of a light-emitting element having a single light-emitting layer (e.g., Patent Document 1).

REFERENCE

[Patent Document 1] Japanese Published Patent Application No. 2003-272860

DISCLOSURE OF INVENTION

In Patent Document 1, a light-emitting element is proposed in which a plurality of light-emitting units (hereinafter in this specification, the light-emitting unit is also referred to as an "EL layer") are provided and separated by a charge-generation layer. More specifically, a light-emitting element is disclosed in which a charge-generation layer formed of vanadium pentoxide is provided over a metal-doped layer functioning as an electron-injection layer of a first light-emitting unit, and further a second light-emitting unit is stacked over the metal-doped layer with the charge-generation layer interposed therebetween. However, in the light-emitting element having such a structure, mutual interaction occurs between the metal-doped layer and the charge-generation layer formed of the oxide at their interface and the interface has a high electric field; thus, high voltage is needed for driving the light-emitting element, unfortunately.

There is a problem in that if a layer which has a peak of an absorption spectrum in a wavelength range of 400 nm to 800 nm that is a visible light region exists in an electron-generation layer, light emission from a light-emitting substance is absorbed into the layer, which results in a decrease in light extraction efficiency. Specifically, a peak of an absorption spectrum in a wavelength range of 420 nm to 720 nm causes a pronounced reduction in efficiency. This problem becomes more serious when a plurality of light-emitting units are stacked.

In view of the above problem, it is an object of the present invention to provide a light-emitting element which can be driven at low voltage. It is another object to provide a light-emitting element with high luminous efficiency. It is another object to provide a light-emitting device the power consumption of which is reduced by manufacturing the light-emitting device using the light-emitting element. It is another object to provide an electronic device or a lighting device the power consumption of which is reduced by using the light-emitting device.

One embodiment disclosed in this specification is a light-emitting element having a structure in which n (n is a natural number of two or more) EL layers are provided between an anode and a cathode, where between the m-th (m is a natural number, $1 \le m \le n-1$) EL layer and the (m+1)-th EL layer, a first layer containing any of an alkali metal, an alkaline earth metal, a rare earth metal, an alkali metal compound, an alkaline earth metal compound, and a rare earth metal compound, a second layer which contains a substance having high electron-transport properties and is in contact with the first layer, and a charge-generation layer which contains a substance having high hole-transport properties and an acceptor substance and is in contact with the second layer are provided in this order over the anode. The charge-generation layer does not have a peak of an absorption spectrum in a visible light region.

One embodiment disclosed in this specification is a light-emitting element having a structure in which n (n is a natural number of two or more) EL layers are provided between an anode and a cathode, where between the m-th (n is a natural number, $1 \le m \le n-1$) EL layer and the (m+1)-th EL layer, a first layer containing a substance having high electron-transport properties and a donor substance, a second layer which contains a substance having high electron-transport properties and is in contact with the first layer, and a charge-generation layer which contains a substance having high hole-transport properties and an acceptor substance and is in contact with the second layer are provided in this order over the anode. The charge-generation layer does not have a peak of an absorption spectrum in a visible light region.

Further, in the above first layer containing the substance having high electron-transport properties and the donor substance, the donor substance may be added so that the mass ratio of the donor substance to the substance having high electron-transport properties is from 0.001:1 to 0.1:1. Further, the donor substance is preferably an alkali metal, an alkaline earth metal, a rare earth metal, an alkali metal compound, an alkaline earth metal compound, or a rare earth metal compound.

Further, in the above structure, the layer containing the substance having high hole-transport properties and the acceptor substance is a layer to which the acceptor substance is added so that the mass ratio of the acceptor substance to the substance having high hole-transport properties is from 0.1:1 to 4.0:1. Of carriers generated in the layer, holes are injected into the (m+1)-th EL layer and electrons move to the second layer. It is preferable that the substance having high hole-transport properties be a carbazole derivative or aromatic hydrocarbon. In addition, it is preferable that the substance having high hole-transport properties does not contain an amine skeleton.

Further, in the above structure, as the substance having high electron-transport properties that is contained in the second layer, a substance whose LUMO level is preferably greater than or equal to −5.0 eV, more preferably greater than or equal to −5.0 eV and less than or equal to −3.0 eV is preferably used.

Furthermore, with the light-emitting element having the above structure, low driving voltage can be realized; therefore, low power consumption of a light-emitting device (e.g., an image display device or a light-emitting device) in which the light-emitting element is used as a light-emitting element can be realized. Thus, a light-emitting device and an electronic device in each of which the light-emitting element having the above structure is used are also included as one embodiment of the present invention.

With the above structure, at least one of the above objects is achieved.

Note that the light-emitting device in this specification includes, in its category, electronic devices such as an image display device and a lighting device in each of which a light-emitting element is used. In addition, the category of the light-emitting device includes a module including a light-emitting element attached with a connector such as a module attached with an anisotropic conductive film, TAB (tape automated bonding) tape, or a TCP (tape carrier package); a module in which the top of the TAB tape or the TCP is provided with a printed wire board; or a module in which an IC (integrated circuit) is directly mounted on a light-emitting element by COG (chip on glass); and the like.

Note that the ordinal numbers such as "first" and "second" in this specification are used for convenience and do not denote the order of steps and the stacking order of layers. In addition, the ordinal numbers in this specification do not denote particular names which specify the invention.

A light-emitting element which has a plurality of light-emitting layers and can be driven at low voltage can be provided. In addition, loss of light extraction efficiency due to absorption of emitted light can be reduced; thus, a light-emitting element with high luminous efficiency can be provided.

Furthermore, by manufacture of a light-emitting device using the above-described light-emitting element, a low-power consumption light-emitting device can be provided. Furthermore, such a light-emitting device is applied to a lighting device and an electronic device, whereby a low-power consumption lighting device and a low-power consumption electronic device can be provided.

BRIEF DESCRIPTION OF DRAWINGS

In the accompanying drawings:

FIGS. 8A and 8B are views illustrating an element structure of light-emitting elements of Examples and an element structure of comparative light-emitting elements of Examples, respectively;

BEST MODE FOR CARRYING OUT THE INVENTION

Figure 1A:
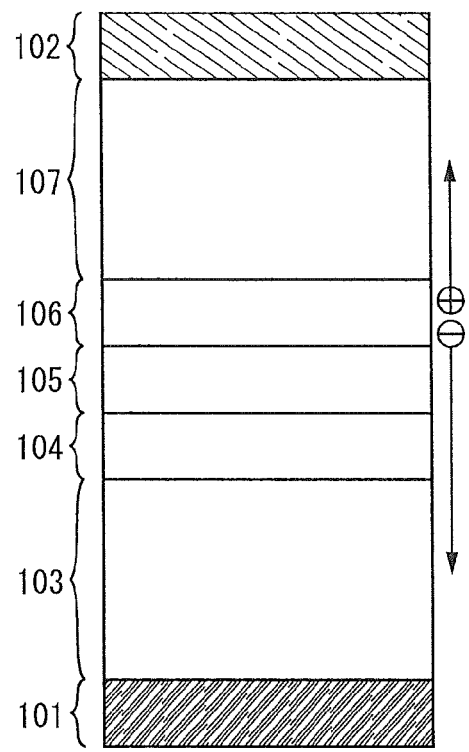
FIGS. 1A and 1B are a view illustrating an example of an element structure of a light-emitting element and a band diagram thereof, respectively.

Hereinafter, Embodiments and Examples will be described with reference to the accompanying drawings. Note that it is easily understood by those skilled in the art that the present invention disclosed in this specification can be carried out in many different modes, and the modes and details disclosed herein can be modified in various ways without departing from the spirit and scope of the present invention. Therefore, the present invention should not be construed as being limited to the description of Embodiments and Examples. In the drawings for explaining Embodiments and Examples, the same parts or parts having a similar function are denoted with the same reference numerals, and description of such parts is omitted.

Embodiment 1

In Embodiment 1, one embodiment of a light-emitting element will be described with reference to FIGS. 1A and 1B.

In an element structure illustrated in FIG. 1A, a first EL layer 103 and a second EL layer 107 each including a light-emitting region are interposed between a pair of electrodes (i.e., an anode 101 and a cathode 102), and between the first EL layer 103 and the second EL layer 107, an electron-injection buffer 104, an electron-relay layer 105, and a charge-generation layer 106 are stacked in this order over the anode 101.

The charge-generation layer 106 is a layer containing a substance having high hole-transport properties and an acceptor substance, where holes and electrons that are carriers of the light-emitting element are generated. The holes generated in the charge-generation layer 106 move to the second EL layer 107 while the electrons move to the electron-relay layer 105. Moreover, since the electron-relay layer 105 has high electron-transport properties, it can quickly transport the electrons to the electron-injection buffer 104. Furthermore, since the electron-injection buffer 104 can reduce injection barriers at the time when the electrons are injected into the first EL layer 103, it can increase the efficiency of electron injection into the first EL layer 103.

A substance having high electron-injection properties can be used for the electron-injection buffer 104: for example, an alkali metal, an alkaline earth metal, a rare earth metal, a compound of the above metal (e.g., an alkali metal compound (an oxide such as lithium oxide, a halide, or carbonate such as lithium carbonate or cesium carbonate), an alkaline earth metal compound (e.g., an oxide, a halide, or carbonate), or a rare earth metal compound (e.g., an oxide, a halide, or carbonate). Alternatively, the electron-injection buffer 104 may contain a substance having high electron-transport properties and a donor substance.

Figure 1B:
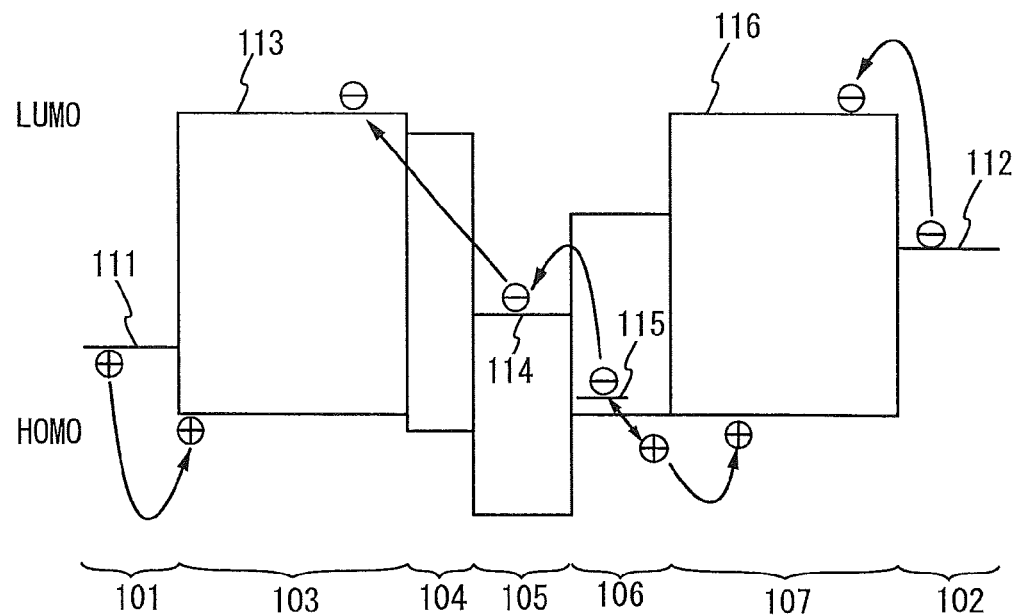

FIG. 1B is a band diagram of the element structure of FIG. 1A. In FIG. 1B, reference numeral 111 denotes the Fermi level of the anode 101; 112, the Fermi level of the cathode 102; 113, the lowest unoccupied molecular orbital (LUMO) level of the first EL layer 103; 114, the LUMO level of the electron-relay layer 105; 115, the acceptor level of an acceptor in the charge-generation layer 106; and 116, the LUMO level of the second EL layer 107.

In FIG. 1B, the holes injected from the anode 101 are injected into the first EL layer 103. In contrast, the electrons generated in the charge-generation layer 106 move to the electron-relay layer 105, and then injected into the first EL layer 103 through the electron-injection buffer 104, and recombined with the holes, whereby light is emitted. In addition, the holes generated in the charge-generation layer 106 move to the second EL layer 107 and recombined with the electrons injected from the cathode 102 in the second EL layer 107, whereby light is emitted.

In the light-emitting element described in this embodiment, since the electron-relay layer 105 functions as a layer for sufficiently injecting electrons generated in the charge-generation layer 106 into the first EL layer 103, the electron-relay layer 105 is preferably formed using a material whose LUMO level is a level between the acceptor level of the acceptor in the charge-generation layer 106 and a LUMO level 113 of the first EL layer 103. Specifically, a material whose LUMO level is greater than or equal to about −5.0 eV is preferably used, and a material whose LUMO level is greater than or equal to −5.0 eV and less than or equal to −3.0 eV is more preferably used.

The acceptor substance contained in the charge-generation layer 106 has strong acceptor properties, and the substance having high electron-injection properties or the donor substance contained in the electron-injection buffer 104 has strong donor properties; therefore, when the charge-generation layer 106 and the electron-injection buffer 104 are in contact with each other, electrons are donated and accepted at the interface between the charge-generation layer 106 and the electron-injection buffer 104, which leads to an increase in driving voltage of the light-emitting element. In addition, the driving voltage of the light-emitting element might be increased when a PN junction is formed at the interface between the charge-generation layer 106 and the electron-injection buffer 104. However, in the light-emitting element described in this embodiment, the charge-generation layer 106 and the electron-injection buffer 104 can be prevented from being in contact with each other by the electron-relay layer 105; thus, the acceptor substance contained in the charge-generation layer 106 and the substance having high electron-injection properties or the donor substance contained in the electron-injection buffer 104 can be prevented from interacting with each other by the electron-relay layer 105. In addition, the electron-relay layer 105 is formed using a material whose LUMO level falls within the above-described range, whereby a high electric field of the interface between the electron-relay layer 105 and the electron-injection buffer 104 is prevented, and the electrons generated in the charge-generation layer 106 can be efficiently injected into the first EL layer 103.

Further, as illustrated in the band diagram of FIG. 1B, the electrons that have moved to the electron-relay layer 105 from the charge-generation layer 106 are easily injected into the LUMO level 113 of the first EL layer 103 because of a reduced injection barrier due to the electron-injection buffer 104. Note that the holes generated in the charge-generation layer 106 move to the second EL layer 107.

Next, a material that can be used for the above-described light-emitting element will be specifically described.

The anode 101 is preferably formed using a metal, an alloy, an electrically-conductive compound, a mixture thereof, or the like having a high work function (specifically, a work function of greater than or equal to 4.0 eV). Specifically, indium tin oxide (ITO), indium tin oxide containing silicon or silicon oxide, indium zinc oxide (IZO), indium oxide containing tungsten oxide and zinc oxide, and the like can be given, for example.

Films of these conductive metal oxides are usually formed by a sputtering method. Alternatively, the films may be formed by application of a sol-gel method or the like. For example, a film of indium zinc oxide (IZO) can be formed by a sputtering method using a target in which zinc oxide is added to indium oxide at 1 wt % to 20 wt %. Indium oxide containing tungsten oxide and zinc oxide can be formed by a sputtering method using a target in which tungsten oxide and zinc oxide are added to indium oxide at 0.5 wt % to 5 wt % and 0.1 wt % to 1 wt %, respectively.

Besides, the following can be given: gold (Au), platinum (Pt), nickel (Ni), tungsten (W), chromium (Cr), molybdenum (Mo), iron (Fe), cobalt (Co), copper (Cu), palladium (Pd), titanium (Ti), a nitride of a metal material (e.g., titanium nitride), molybdenum oxide, vanadium oxide, ruthenium oxide, tungsten oxide, manganese oxide, titanium oxide, and the like. Alternatively, a conductive polymer such as poly(3,4-ethylenedioxythiophene)/poly(styrenesulfonic acid) (PEDOT/PSS) or polyaniline/poly(styrenesulfonic acid) (PAni/PSS) may be used. Note that, in the case where a charge-generation layer to be in contact with the anode 101 is provided as part of the first EL layer 103, a variety of conductive materials such as Al and Ag can be used for the anode 101 regardless of the magnitude of their work functions.

The cathode 102 can be formed using a metal, an alloy, an electrically-conductive compound, a mixture of thereof, or the like having a low work function (specifically, a work function of less than or equal to 3.8 eV). As specific examples of such a cathode material, the following can be given: an element that belongs to Group 1 or 2 of the periodic table, that is, an alkali metal such as lithium (Li) or cesium (Cs), an alkaline earth metal such as magnesium (Mg), calcium (Ca), or strontium (Sr), an alloy containing these (e.g., an MgAg alloy or an AlLi alloy), a rare-earth metal such as europium (Eu) or ytterbium (Yb), an alloy containing these, and the like. Note that a film of an alkali metal, an alkaline earth metal, or an alloy thereof can be formed by a vacuum evaporation method. Alternatively, an alloy containing an alkali metal or an alkaline earth metal can be formed by a sputtering method. Further alternatively, a film can be formed using silver paste or the like by an ink-jet method or the like.

Alternatively, the cathode 102 can be formed using a stack of a film of a metal such as aluminum and a thin film of an alkali metal compound, an alkaline earth metal compound, or a rare earth metal compound (e.g., lithium fluoride (LiF), lithium oxide (LiOx), cesium fluoride (CsF), calcium fluoride ($CaF_2$), or erbium fluoride ($ErF_3$)). Note that in the case where the charge-generation layer to be in contact with the cathode 102 is provided as part of the second EL layer 107, a variety of conductive materials such as Al, Ag, ITO, and indium tin oxide containing silicon or silicon oxide can be used for the cathode 102 regardless of the magnitude of their work functions.

Note that in the light-emitting element described in this embodiment, at least one of the anode and the cathode may have light-transmitting properties. The light-transmitting properties can be ensured with the use of a transparent electrode such as ITO, or by a reduction in the thickness of an electrode.

The first EL layer 103 and the second EL layer 107 each may include at least a light-emitting layer, and may also have a structure in which a light-emitting layer and layers other than the light-emitting layer are stacked. Note that the light-emitting layer included in the first EL layer 103 may be different from the light-emitting layer included in the second EL layer 107. Alternatively, the first EL layer 103 and the second EL layer 107 may independently have a structure in which a light-emitting layer and layers other than the light-emitting layer are stacked. As the layers other than the light-emitting layer, there are layers formed of a substance having high hole-injection properties, a substance having high hole-transport properties, a substance having high electron-transport properties, a substance having high electron-injection properties, a substance having bipolar properties (a substance having high electron-and-hole-transport properties), and the like. Specifically, a hole-injection layer, a hole-transport layer, a light-emitting layer, a hole-blocking layer, an electron-transport layer, an electron-injection layer, and the like are given, and they can be combined as appropriate and stacked over the anode. Furthermore, a charge-generation layer can be provided in a part of the first EL layer 103, which is on the side where the first EL layer 103 is in contact with the anode 101.

A material which is used for forming each of the above-described layers included in the EL layer will be specifically described below.

The hole-injection layer is a layer containing a substance having high hole-injection properties. As the substance having high hole-injection properties, for example, molybdenum oxide, vanadium oxide, ruthenium oxide, tungsten oxide, manganese oxide, or the like can be used. Besides, a phthalocyanine-based compound such as phthalocyanine (abbreviation: $H_2Pc$) or copper phthalocyanine (abbreviation: CuPc), a high molecule such as poly(3,4-ethylenedioxythiophene)/poly(styrenesufonic acid) (PEDOT/PSS), or the like can also be used for forming the hole-injection layer.

The hole-transport layer is a layer containing a substance having high hole-transport properties. As examples of the material having high hole-transport properties, the following can be given, for example: aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4''-tris(carbazol-9-yl)triphenylamine (abbreviation: TCTA), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), and 4,4'-bis[N-(spiro-9,9'-bifluorene-2-yl)-N-phenylamino]biphenyl (abbreviation: BSPB); 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like. Alternatively, the following carbazole derivative can be used: 4,4'-di(N-carbazolyl)biphenyl (abbreviation: CBP), 1,3,5-tris[4-(N-carbazolyl)phenyl]benzene (abbreviation: TCPB), and 9-[4-(10-phenyl-9-anthryl)phenyl]-9H-carbazole (abbreviation: CzPA). The substances listed here are mainly materials having a hole mobility of greater than or equal to $10^{-6}$ $cm^2/Vs$. However, substances other than those can also be used as long as they have hole-transport properties higher than electron-transport properties. The layer containing a substance having high hole-transport properties is not limited to a single layer, and may be a stack of two or more layers containing the above-described substances.

In addition to the above substances, a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), or poly[N,N'-bis(4-butylphenyl)-N,N'-bis(phenyl)benzidine] (abbreviation: Poly-TPD) can be used for the hole-transport layer.

The light-emitting layer is a layer containing a light-emitting substance. As the light-emitting substance, the following fluorescent compound can be used, for example: N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-antryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N''-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol- 3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), and the like.

Alternatively, as the light-emitting substance, the following phosphorescent compound can be used, for example: bis[2-(4',6'-difluorophenyOpyridinato-$N,C^{2'}$]iridium(III)tetrakis(1-pyrazolyl)borate (abbreviation: FIr6), bis[2-(4',6'-difluorophenyppyridinato-$N,C^{2'}$]iridium(III)picolinate (abbreviation: FIrpic), bis[2-(3',5'-bistrifluoromethylphenyl)pyridinato-$N,C^{2'}$]iridium(III)picolinate (abbreviation: Ir(CF$_3$ppy)$_2$(pic)), bis[2-(4',6'-difluorophenyl)pyridinato-$N,C^{2'}$]iridium(III)acetylacetonate (abbreviation: FIracac), tris(2-phenylpyridinato)iridium(III) (abbreviation: Ir(ppy)$_3$), bis(2-phenylpyridinato)iridium(III)acetylacetonato (abbreviation: Ir(ppy)$_2$(acac)), bis(benzo[h]quinolinato)iridium(III)acetylacetonate (abbreviation: Ir(bzq)$_2$(acac)), bis(2,4-diphenyl-1,3-oxazolato-$N,C^{2'}$)iridium(III)acetylacetonate (abbreviation: Ir(dpo)$_2$(acac)), bis[2-(4'-perfluorophenyl-phenyl)pyridinato]iridium(III)acetylacetonate (abbreviation: Ir(p-PF-ph)$_2$(acac)), bis(2-phenylbenzothiazolato-$N,C^{2'}$)iridium(III)acetylacetonate (abbreviation: Ir(bt)$_2$(acac)), bis[2-(2'-benzo[4,5-a]thienyl)pyridinato-$N,C^{3'}$]iridium(III)acetylacetonate (abbreviation: Ir(btp)$_2$(acac)), bis(1-phenylisoquinolinato-$N,C^{2'}$)iridium(III)acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$ (acac)), (acetylacetonato)bis(2,3,5-triphenylpyrazinato)iridium(III) (abbreviation: Ir(tppr)$_2$(acac)), 2,3,7,8,12,13,17,18-octaethyl-21H,23H-porphyrin platinum (II) (abbreviation: PtOEP), tris(acetylacetonato)(monophenanthroline)terbium(III) (abbreviation: Tb(acac)$_3$(Phen)), tris(1,3-diphenyl-1,3-propanedionato)(monophenanthroline)europium (III) (abbreviation: Eu(DBM)$_3$(Phen)), tris[1-(2-thenoyl)-3,3,3-trifluoroacetonato](monophenanthroline)europium(III) (abbreviation: Eu(TTA)$_3$(Phen)), and the like.

Note that those light-emitting substances are preferably dispersed in a host material to be used. As the host material, for example, the following can be used: an aromatic amine compound such as NPB (abbreviation), TPD (abbreviation), TCTA (abbreviation), TDATA (abbreviation), MTDATA (abbreviation), or BSPB (abbreviation); a carbazole derivative such as PCzPCA1 (abbreviation), PCzPCA2 (abbreviation), PCzPCN1 (abbreviation), CBP (abbreviation), TCPB (abbreviation), CzPA (abbreviation), or 4-(1-naphthyl)-4'-(9-phenyl-9H-carbazol-3-yl)-triphenylamine (abbreviation: PCBANB); a substance having high hole-transport properties which contains a high molecular compound, such as PVK (abbreviation), PVTPA (abbreviation), PTPDMA (abbreviation), or Poly-TPD (abbreviation); a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), or bis(2-methyl-8-quinolinolato)(4-phenylphenolato)aluminum (abbreviation: BAlq); a metal complex having an oxazole-based or thiazole-based ligand, such as bis[2-(2-hydroxyphenyl)benzoxazolato]zinc (abbreviation: Zn(BOX)$_2$) or bis[2-(2-hydroxyphenyl)-benzothiazolato]zinc (abbreviation: Zn(BTZ)$_2$); or a material having high electron-transport properties, such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl] benzene (abbreviation: OXD-7), 9-[4-(5-phenyl-1,3,4-oxadiazol-2-yl)phenyl]carbazole (abbreviation: CO11), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), poly[(9,9-dihexylfluorene-2,7-diyl)-co-(pyridine-3,5-diyl)] (abbreviation: PF-Py), or poly[(9,9-dioctyllfluorene-2,7-diyl)-co-(2,2'-bipyridine-6,6'-diyl)] (abbreviation: PF-BPy).

The electron-transport layer is a layer containing a substance having high electron-transport properties. As the substance having high electron-transport properties, for example, a metal complex having a quinoline skeleton or a benzoquinoline skeleton, such as Alq (abbreviation), Almq$_3$ (abbreviation), BeBq$_2$ (abbreviation), or BAlq (abbreviation) can be used. Besides, a metal complex having an oxazole-based or thiazole-based ligand, such as Zn(BOX)$_2$ (abbreviation) or Zn(BTZ)$_2$ (abbreviation) can also be used. Furthermore, in addition to the above metal complexes, PBD (abbreviation), OXD-7 (abbreviation), CO11 (abbreviation), TAZ (abbreviation), BPhen (abbreviation), BCP (abbreviation), or the like can be used. The substances listed here are mainly materials having an electron mobility of greater than or equal to $10^{-6}$ cm$^2$/Vs. Note that substances other than those may be used as long as they have electron-transport properties higher than hole-transport properties. Furthermore, the electron-transport layer may have a structure in which two or more layers formed of the above substances are stacked, without limitation to a single-layer structure.

In addition to the above substances, a high molecular compound such as PF-Py (abbreviation) or PF-BPy (abbreviation) can be used for the electron-transport layer.

The electron-injection layer is a layer containing a substance having high electron-injection properties. As examples of the substance having high electron-injection properties, the following can be given: an alkali metal or an alkaline earth metal such as lithium fluoride (LiF), cesium fluoride (CsF), and calcium fluoride (CaF$_2$), and a compound thereof. Besides, a layer containing a substance having electron-transport properties and an alkali metal, an alkaline earth metal, or a compound thereof (e.g., Alq containing magnesium (Mg)) can be used. Such a structure makes it possible to increase the efficiency of electron injection from the cathode 102.

In the case where a charge-generation layer is provided in the first EL layer 103 or the second EL layer 107, the charge-generation layer is a layer that contains a substance having high hole-transport properties and an acceptor substance. The charge-generation layer is formed in the first EL layer 103 or the second EL layer 107, whereby the anode 101 or the cathode 102 can be formed without consideration of a work function of a material for forming an electrode.

As examples of the acceptor substance that is used for the charge-generation layer, a transition metal oxide and an oxide of a metal belonging to any of Groups 4 to 8 of the periodic table can be given. Specifically, molybdenum oxide is particularly preferable. Note that molybdenum oxide has low hygroscopic properties.

As the substance having high hole-transport properties used for the charge-generation layer, any of a variety of organic compounds such as a carbazole derivative, aromatic hydrocarbon, and a high molecular compound (such as an oligomer, a dendrimer, or a polymer) can be used. Specifically, a material having a hole mobility of greater than or equal to $10^{-6}$ cm$^2$/Vs is preferable. However, substances other than those can also be used as long as they have hole-transport properties higher than electron-transport properties.

Note that those layers are stacked in appropriate combination, whereby the first EL layer 103 or the second EL layer 107 can be formed. Further, as a formation method of the first EL layer 103 or the second EL layer 107, any of a variety of methods (e.g., a dry process or a wet process) can be selected as appropriate depending on a material to be used. For example, a vacuum evaporation method, an ink jet method, a spin coating method, or the like can be used. Note that the layers may be formed by different methods.

Further, between the first EL layer 103 and the second EL layer 107, the electron-injection buffer 104, the electron-relay layer 105, and the charge-generation layer 106 are provided in this order over the anode 101. The charge-generation layer 106 is formed in contact with the second EL layer 107, the electron-relay layer 105 is formed in contact with the charge-generation layer 106, and the electron-injection buffer 104 is formed in contact with and between the electron-relay layer 105 and the first EL layer 103.

The charge-generation layer 106 is a layer that contains a substance having high electron-transport properties and an acceptor substance. A substance which does not have a peak of an absorption spectrum in a visible light region is used for the charge-generation layer 106 and the charge-generation layer 106 that can be formed in part of the first EL layer 103 or the second EL layer 107 which is described above, whereby extraction efficiency of light emitted from the light-emitting layer can be improved. Specifically, a substance which does not have an absorption peak in the wavelength range of 420 nm to 720 nm in a visible light region is used for the charge-generation layer 106, whereby luminous efficiency can be substantially improved.

As the substance having high hole-transport properties used for the charge-generation layer 106, any of a variety of organic compounds such as a carbazole derivative, aromatic hydrocarbon, and a high molecular compound (e.g., an oligomer, a dendrimer, or a polymer) can be used. The carbazole derivative and aromatic hydrocarbon are preferable because they have excellent properties of injecting holes into an EL layer due to their generally deep HOMO level. In addition, those substances are preferable because absorption based on charge transfer interaction does not easily occur between those substances and an acceptor substance such as molybdenum oxide due to their deep HOMO level. Specifically, a substance having a hole mobility of greater than or equal to $10^{-6}$ cm$^2$/Vs is preferable. However, substances other than those can also be used as long as they have hole-transport properties higher than electron-transport properties.

As specific examples of the carbazole derivative, the following can be given: 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like. Besides, the following can be given: 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 9-phenyl-3-[4-(10-phenyl-9-anthryl)phenyl]-9H-carbazole (abbreviation: PCzPA), 1,4-bis[4-(N-carbazolyl)phenyl]-2,3,5,6-tetraphenylbenzene, and the like.

As specific examples of the aromatic hydrocarbon, the following can be given: 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene; 2,5,8,11-tetra(tert-butyl)perylene, and the like. Besides, pentacene, coronene, or the like can be used. In this way, the aromatic hydrocarbon having a hole mobility of greater than or equal to $1\times10^{-6}$ cm$^2$/Vs and 14 to 42 carbon atoms is more preferably used.

Further, the aromatic hydrocarbon may have a vinyl skeleton. As examples of the aromatic hydrocarbon having a vinyl group, for example, 4,4'-bis(2,2-diphenylvinyl)biphenyl (abbreviation: DPVBi), 9,10-bis[4-(2,2-diphenylvinyl)phenyl]anthracene (abbreviation: DPVPA), and the like can be given.

Moreover, a high molecular compound such as poly(N-vinylcarbazole) (abbreviation: PVK) or poly(4-vinyltriphenylamine) (abbreviation: PVTPA) can be used.

Here, in particular, it is preferable that the substance having high hole-transport properties does not contain an amine skeleton. The present inventors found out that in the case where the charge-generation layer 106 is formed using an acceptor substance and a compound which does not contain an amine skeleton, the charge-generation layer 106 serves as a charge-generation layer although no absorption based on charge transfer interaction between the substance having high hole-transport properties and the acceptor substance occurs. This allows a charge-generation layer which does not have an absorption peak in a visible light region to be easily formed; thus, a decrease in luminous efficiency due to absorption of light can be prevented.

Note that as described in Patent Document 1, conventionally, it is conventionally important that a charge transfer complex be formed in a charge-generation layer by oxidation-reduction reaction. In addition, according to Patent Document 1, when the ionization potential of an organic compound is 5.7 eV or higher, the oxidation-reduction reaction between the organic compound and an acceptor substance is less likely to occur. Thus, in order to promote the occurrence of oxidation-reduction reaction, a substance the ionization potential of which is 5.7 eV or lower, specifically, a substance having high electron-donor properties, such as arylamine, has been needed as an organic compound. However, when oxidation-reduction reaction occurs between such a compound having an arylamine skeleton and an acceptor substance, absorption based on charge transfer interaction is generated in the visible light region and the infrared region. In fact, the absorption spectrum disclosed in Patent Document 1 shows that new absorption is generated at wavelengths of around 500 nm and 1300 nm by mixing a compound having an arylamine skeleton with oxide vanadium. In addition, when the compound having an arylamine skeleton is mixed with 7,7,8,8-tetracyano-2,3,5,6-tetrafluoroquinodimethane (abbreviation: $F_4$-TCNQ), new absorption is generated at wavelengths of around 700 nm, 900 nm, and 1200 nm. In that case, an absorption peak especially in the visible light region triggers a decrease in luminous efficiency. However, formation of a charge transfer complex has been conventionally considered to be indispensable for a charge-generation layer and absorption to be inevitable.

In contrast, in one embodiment of the present invention, the charge-generation layer 106 is formed using an acceptor substance and a compound which does not contain an amine skeleton; however, the charge-generation layer 106 functions as a charge-generation layer although no absorption based on charge transfer interaction is exhibited in a visible light region and an infrared region. In such a charge-generation layer, electric charge might be generated by application of an electric field, and holes and electrons might be injected into the EL layer. This aspect is different from that of a conventional charge-generation layer. In fact, 9-[4-(10-phenyl-9-anthracenyl)phenyl]-9H-carbazole (abbreviation: CzPA) that is a carbazole derivative not containing an amine skeleton does not generate absorption based on charge transfer interaction even if it is mixed with molybdenum oxide that is an acceptor substance, probably because the ionization potential of CzPA of 5.7 eV (AC-2, product of Riken Keiki Co., Ltd.) is pretty high for a value of ionization potential. However, the charge-generation layer 106 functions as a charge-generation layer; thus, a compound which does not contain an amine skeleton and an acceptor substance can be used in one embodiment of the present invention. Thus, the ionization potential of the compound which does not contain an amine skeleton is preferably greater than or equal to 5.7 eV.

Note that as examples of the compound not containing an amine skeleton, the following can be preferably given: the above-described carbazole derivatives such as CBP (abbreviation), TCPB (abbreviation), CzPA (abbreviation), PCzPA (abbreviation), and 1,4-bis[4-(N-carbazolyl)phenyl]-2,3,5,6-tetraphenylbenzene; and aromatic hydrocarbon such as t-BuDNA (abbreviation), DPPA (abbreviation), t-BuDBA (abbreviation), DNA (abbreviation), DPAnth (abbreviation), t-BuAnth (abbreviation), DMNA (abbreviation), 2-tert-butyl-9,10-di(1-naphthyl)anthracene, 9,10-bis[2-(1-naphthyl)phenyl]-2-tert-butylanthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9',9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, DPVBi (abbreviation), and DPVPA (abbreviation). Further, a polymer of a carbazole derivative, such as PVK, may be used.

As examples of the acceptor substance that is used for the charge-generation layer 106, a transition metal oxide and an oxide of a metal belonging to any of Groups 4 to 8 of the periodic table can be given. Specifically, vanadium oxide, niobium oxide, tantalum oxide, chromium oxide, molybdenum oxide, tungsten oxide, manganese oxide, and rhenium oxide are preferable because of their high electron-transport properties. Among them, molybdenum oxide is particularly preferable. Molybdenum oxide has low hygroscopic properties. Besides, an organic compound such as 7,7,8,8-tetracyano-2,3,5,6-tetrafluoroquinodimethane (abbreviation: $F_4$-TCNQ), chloranil can be given.

Furthermore, in optical design, when the thickness of each layer is changed, driving voltage might be increased. For that reason, it is preferable that the optical design be performed on the charge-generation layer 106 because a change in driving voltage is small even in the case where the thickness of the charge-generation layer 106 is changed. However, the thickness of the charge-generation layer 106 having a peak of an absorption spectrum in the visible light region is increased, light emitted from the light-emitting layer is absorbed into the charge-generation layer 106, which results in a decrease in light extraction efficiency. Thus, a substance that is used for the charge-generation layer 106 is preferably a substance that does not have a peak of an absorption spectrum in the visible light region. Using the substance that does not have a peak of an absorption spectrum in the visible light region for the charge-generation layer 106 makes it possible to improve extraction efficiency of light emitted from the light-emitting layer. In addition, increasing the thickness of the charge-generation layer 106 can prevent a short circuit of the light-emitting element.

Note that it is preferable that the acceptor substance be added to the charge-generation layer 106 so that the mass ratio of the acceptor substance to a substance having high hole-transport properties is from 0.1:1 to 4.0:1.

Note that the charge generation layer formed in part of the first EL layer 103 or the second EL layer 107 which is described above can be formed using a material similar to that of the charge-generation layer 106 and can have a structure similar to that of the charge-generation layer 106. In addition, a substance that does not have a peak of an absorption spectrum in the visible light region is used for the charge-generation layer formed in part of the first EL layer 103 or the second EL layer 107 and the charge-generation layer 106, whereby extraction efficiency of light emitted from the light-emitting layer can be further improved. Specifically, a substance which does not have an absorption peak in the wavelength range of 420 nm to 720 nm in a visible light region is used for the charge-generation layer 106, whereby luminous efficiency can be substantially improved.

The electron-relay layer 105 is a layer that can quickly receive electrons drawn out by the acceptor substance in the charge-generation layer 106. Therefore, the electron-relay layer 105 is a layer that contains a substance having high electron-transport properties and is preferably formed using a material having a LUMO level between the acceptor level of the acceptor in the charge-generation layer 106 and the LUMO level of the first EL layer 103. Specifically, a material whose LUMO level is about greater than or equal to −5.0 eV is preferably used, and a material whose LUMO level is about greater than or equal to −5.0 eV and less than or equal to −3.0 eV is more preferably used. As examples of the material used for the electron-relay layer 105, a perylene derivative and a nitrogen-containing condensed aromatic compound can be given. Note that a nitrogen-containing condensed aromatic compound is preferably used for the electron-relay layer 105 because of its stability. Furthermore, of nitrogen-containing condensed aromatic compounds, a compound having an electron-withdrawing group such as a cyano group or a fluoro group is preferably used, in which case electrons are more easily received in the electron-relay layer 105.

Here, it is preferable that the thickness of the electron-relay layer 105 be reduced in order to reduce driving voltage. In addition, reducing the thickness of the electron-relay layer 105 makes it possible to improve extraction efficiency of light emitted from the light-emitting layer. In particular, most of compounds which are favorable for the electron-relay layer (e.g., a perylene derivative described below) have strong absorption in the visible light region; thus, the electron-relay layer preferably has a small thickness of about 1 nm to 10 nm in terms of light extraction efficiency. Note that since the thickness of the electron-relay layer is preferably reduced as described above, it is preferable that the thickness of the charge-generation layer be changed in performing optical design. Further, in one embodiment of the present invention, the charge-generation layer does not have an absorption peak in the visible light region, and thus light extraction efficiency is not impaired even in the case where the thickness of the charge-generation layer is increased. In other words, a combination of the electron-relay layer for reducing driving voltage and the charge-generation layer which does not have an absorption peak in the visible light region and with which higher efficiency can be achieved is quite effective.

As specific examples of the perylene derivative, the following can be given: 3,4,9,10-perylenetetracarboxylicdianhydride (abbreviation: PTCDA), 3,4,9,10-perylenetetracarboxylic-bis-benzimidazole (abbreviation: PTCBI), N,N'-dioctyl-3,4,9,10-perylenetetracarboxylic diimide (abbreviation: PTCDI-C8H), N,N'-dihexyl-3,4,9,10-perylenetetracarboxylicdiimide (HexPTC), and the like.

As specific examples of the nitrogen-containing condensed aromatic compound, the following can be given: pirazino[2,3-f][1,10]phenanthroline-2,3-dicarbonitrile (abbreviation: PPDN), 2,3,6,7,10,11-hexacyano-1,4,5,8,9,12-hexaazatriphenylene (abbreviation: HAT(CN)$_6$), 2,3-diphenylpyrido[2,3-b]pyrazine (abbreviation: 2PYPR), 2,3-bis(4-fluorophenyl)pyrido[2,3-b]pyrazine (abbreviation: F2PYPR), and the like. Besides, perfluoropentacene, 7,7,8,8-tetracyanoquinodimethane (abbreviation: TCNQ), 1,4,5,8-naphthalenetetracarboxylicdianhydride (abbreviation: NTCDA), copper hexadecafluoro phthalocyanine (abbreviation: $F_{16}$CuPc), N,N'-bis(2,2,3,3,4,4,5,5,6,6,7,7,8,8,8-pentadecafluorooctyl-1,4,5,8-naphthalenetetracarboxylic diimide (abbreviation: NTCDI-C8F), 3',4'-dibutyl-5,5'''-bis(dicyanomethylene)-5,5'''-dihydro-2,2':5',2''-terthiophen) (abbreviation: DCMT), methanofullerene such as [6,6]-phenyl $C_{61}$ butyric acid methyl ester, or the like can be used for the electron-relay layer 105.

The electron-injection buffer 104 is a layer that can inject the electrons received by the electron-relay layer 105 into the first EL layer 103. The provision of the electron-injection buffer 104 makes it possible to reduce the injection barrier between the charge-generation layer 106 and the first EL layer 103; thus, the electrons generated in the charge-generation layer 106 can be easily injected into the first EL layer 103.

A substance having high electron-injection properties can be used for the electron-injection buffer 104: for example, an alkali metal, an alkaline earth metal, a rare earth metal, a compound of the above metal (e.g., an alkali metal compound (e.g., an oxide such as lithium oxide, a halide, or carbonate such as lithium carbonate or cesium carbonate), an alkaline earth metal compound (e.g., an oxide, a halide, or carbonate), or a rare earth metal compound (e.g., an oxide, a halide, or carbonate).

Further, in the case where the electron-injection buffer 104 contains a substance having high electron-transport properties and a donor substance, the donor substance is preferably added so that the mass ratio of the donor substance to the substance having high electron-transport properties is from 0.001:1 to 0.1:1. Note that as the donor substance, an organic compound such as tetrathianaphthacene (abbreviation: TTN), nickelocene, or decamethylnickelocene can be used as well as an alkali metal, an alkaline earth metal, a rare earth metal, a compound of the above metal (e.g., an alkali metal compound (e.g., an oxide such as lithium oxide, a halide, or carbonate such as lithium carbonate or cesium carbonate), an alkaline earth metal compound (e.g., an oxide, a halide, and carbonate), or a rare earth metal compound (e.g., an oxide, a halide, and carbonate). Note that as the substance having high electron-transport properties, a material similar to the above-described material for the charge-generation layer that can be formed in part of the first EL layer 103 can be used.

The light-emitting element described in this embodiment can be manufactured by combination of the above-described materials. Although light emission from the above-described light-emitting substance can be obtained with this light-emitting element, a variety of emission colors can be obtained by changing the type of the light-emitting substance that is used for the light-emitting layer. In addition, a plurality of light-emitting substances of different colors are used as the light-emitting substance, whereby light emission having a broad spectrum or white light emission can also be obtained.

Note that, although the light-emitting element in which two EL layers are provided is described in this embodiment, the number of EL layers is not limited to two, and may be, for example, three. In the case where n (n is a natural number of two or more) EL layers are provided in a light-emitting element, an electron-injection buffer, an electron-relay layer, and a charge-generation layer are stacked in this order over the anode, between the m-th (m is a natural number, 1≤m≤n−1) EL layer and the (m+1)-th EL layer, whereby an increase in the driving voltage of the light-emitting element can be suppressed.

Further, the light-emitting element described in this embodiment can be formed over any of a variety of substrates. As the substrate, for example, a substrate made of glass, plastic, a metal plate, metal foil, or the like can be used. In the case where light emission from the light-emitting element is extracted from the substrate side, a substrate having light-transmitting properties may be used. Note that as the substrate, a substrate other than the above may be used as long as it can serve as a support in the manufacturing process of the light-emitting element.

Note that a passive matrix light-emitting device in which both electrodes are formed in a grid pattern over the same substrate can be manufactured with the element structure of the light-emitting element described in this embodiment. In addition, an active matrix light-emitting device including a light-emitting element which is electrically connected to a thin film transistor (TFT) functioning as a switch, or the like and the driving of which is controlled by the TFT can also be manufactured. Note that the structure of the TFT is not particularly limited. Either one of a staggered TFT or an inverted staggered TFT may be employed. In addition, a driver circuit formed with a TFT may be formed using an n-channel TFT and a p-channel TFT, or using either one of an n-channel TFT or a p-channel TFT. Crystallinity of a semiconductor film used for the TFT is not particularly limited, either. An amorphous semiconductor film may be used, or a crystalline semiconductor film may be used. Alternatively, a single crystal semiconductor film or a microcrystalline semiconductor may be used. Further alternatively, an oxide semiconductor, for example, an oxide semiconductor containing indium, gallium, and zinc can be used.

Further, the light-emitting element described in this embodiment can be manufactured by any of a variety of methods regardless of whether it is a dry process (e.g., a vacuum evaporation method or a sputtering method) or a wet process (e.g., an ink-jet method, a spin coating method, or an application method).

In addition, when the element structure described in this embodiment is employed, the electron-relay layer 105 is interposed between the charge-generation layer 106 and the electron-injection buffer 104. In that case, a structure in which the acceptor contained in the charge-generation layer 106 and the substance having high electron-injection properties or the donor substance contained in the electron-injection buffer 104 are less likely to interact, and thus their functions are less likely to be inhibited can be obtained. Thus, the light-emitting element can be driven at low voltage.

Note that the structure described in this embodiment can be combined with any of the structures described in other embodiments as appropriate.

Embodiment 2

In Embodiment 2, an example of the light-emitting element included in the basic structure described in Embodiment 1 will be described with reference to FIGS. 2A and 2B. Specifically, a case where the electron-injection buffer 104 in the light-emitting element described in Embodiment 1 has a single layer of an alkali metal, an alkaline earth metal, a rare earth metal, or a compound thereof will be described.

Figure 2A:
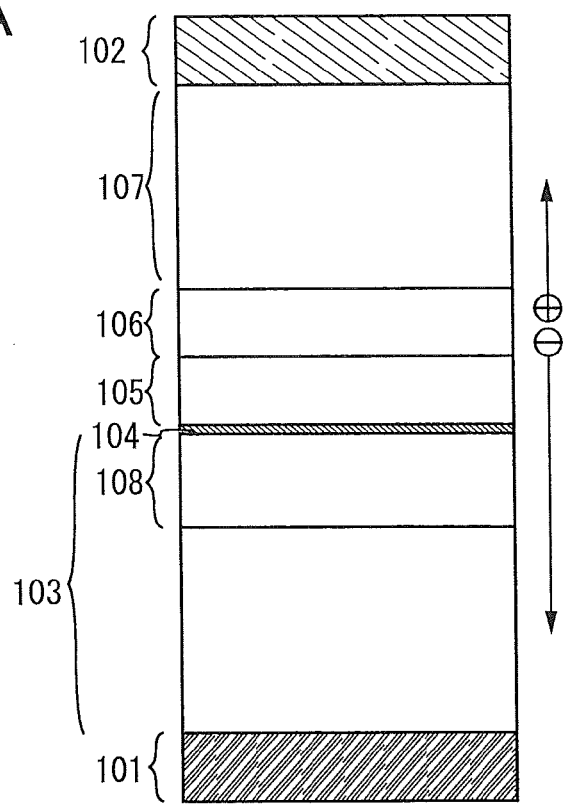
FIGS. 2A and 2B are a view illustrating an example of an element structure of a light-emitting element and a band diagram thereof, respectively.

As illustrated in FIG. 2A, in a light-emitting element described in this embodiment, the first EL layer 103 and the second EL layer 107 each including a light-emitting region are interposed between a pair of electrodes (i.e., the anode 101 and the cathode 102), and between the first EL layer 103 and the second EL layer 107, the electron-injection buffer 104, the electron-relay layer 105, and the charge-generation layer 106 are stacked in this order over the anode 101.

The anode 101, the cathode 102, the first EL layer 103, the second EL layer 107, the charge-generation layer 106, and the electron-relay layer 105 in Embodiment 2 can be formed using materials similar to those described in Embodiment 1.

In this embodiment, as examples of a substance used for the electron-injection buffer 104, the following can be given: substances having high electron-injection properties, such as alkali metals such as lithium (Li) and cesium (Cs); alkaline earth metals such as magnesium (Mg), calcium (Ca), and strontium (Sr); rare earth metals such as europium (Eu) and ytterbium (Yb); alkali metal compounds (e.g., an oxide such as lithium oxide, a halide, and carbonate such as lithium carbonate and cesium carbonate); alkaline earth metal compounds (e.g., an oxide, a halide, and carbonate), and rare earth metal compounds (e.g., an oxide, a halide, and carbonate); and the like.

In the light-emitting element described in this embodiment, a single layer of any of the above-described metals or a compound thereof is provided as the electron-injection buffer 104. The electron-injection buffer 104 is formed to have a very small thickness (specifically, less than or equal to 1 nm) so that an increase in the driving voltage is prevented. Note that in this embodiment, the electron-transport layer 108 is preferably formed in contact with the electron-injection buffer 104 in the first EL layer 103 and that the electron-injection buffer 104 is provided as almost an interface between the electron-relay layer 105 and the electron-transport layer 108 which is part of the EL layer 103. However, in the case where the electron-injection buffer 104 is formed over the electron-transport layer 108 after the electron-transport layer 108 is formed, the substance used for forming the electron-injection buffer 104 can partly exist in the electron-transport layer 108 as well that is part of the EL layer 103. Similarly, the substance used for forming the electron-injection buffer 104 can partly exist in the electron-relay layer 105 as well.

Figure 2B:
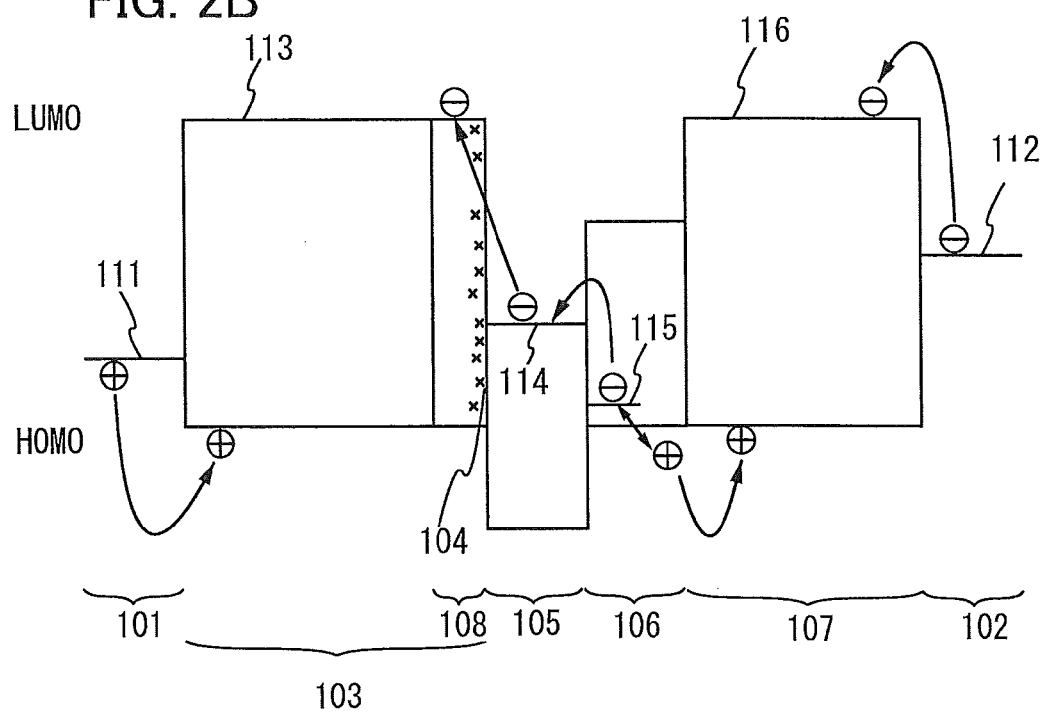

FIG. 2B is a band diagram of the element structure of FIG. 2A. In FIG. 2B, the electron-injection buffer 104 is provided at the interface between the electron-relay layer 105 and the first EL layer 103, whereby the injection barrier between the charge-generation layer 106 and the first EL layer 103 can be reduced; thus, electrons generated in the charge-generation layer 106 can be easily injected into the first EL layer 103. In addition, holes generated in the charge-generation layer 106 move to the second EL layer 107.

The structure of the electron-injection buffer described in this embodiment makes it possible to reduce the driving voltage of the light-emitting element in comparison with a structure of an electron-injection buffer described in Embodiment 3 (that is, the electron-injection buffer is formed by addition of a donor substance to a substance having high electron-transport properties). Note that in this embodiment, as the substance having high electron-injection properties in the electron-injection buffer 104, an alkali metal compound (e.g., an oxide such as lithium oxide, a halide, or carbonate such as lithium carbonate or cesium carbonate), an alkaline earth metal compound (e.g., an oxide, a halide, or carbonate), a rare earth metal compound (e.g., an oxide, a halide, or carbonate), or the like is preferably used. The above substance having high electron-injection properties is stable in the air, and therefore provide high productivity and are suitable for mass production.

Note that the structure described in this embodiment can be combined with any of the structures described in other embodiments as appropriate.

Embodiment 3

In Embodiment 3, an example of the light-emitting element included in the basic structure described in Embodiment 1 will be described with reference to FIGS. 3A and 3B. Specifically, a case where the electron-injection buffer 104 in the light-emitting element described in Embodiment 1 contains a substance having high electron-transport properties and a donor substance.

Figure 3A:
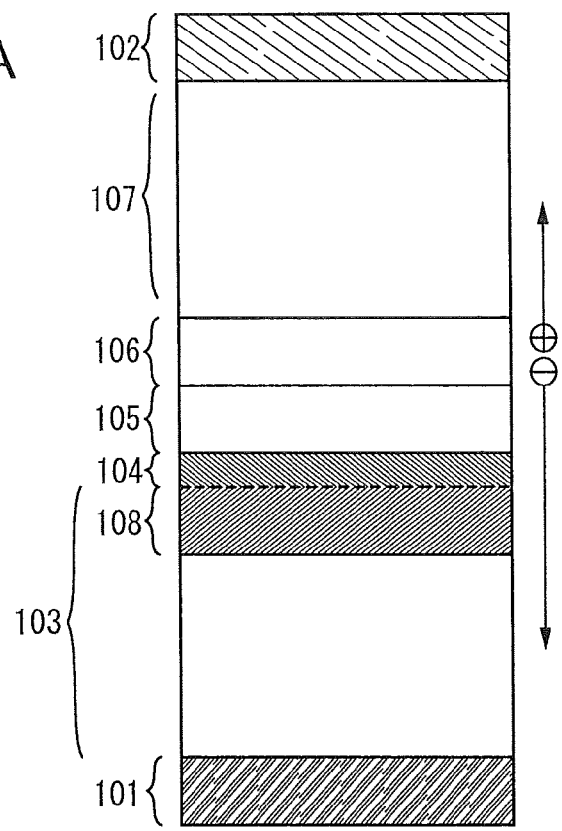
FIGS. 3A and 3B are a view illustrating an example of an element structure of a light-emitting element and a band diagram thereof, respectively.
Figure 3B:
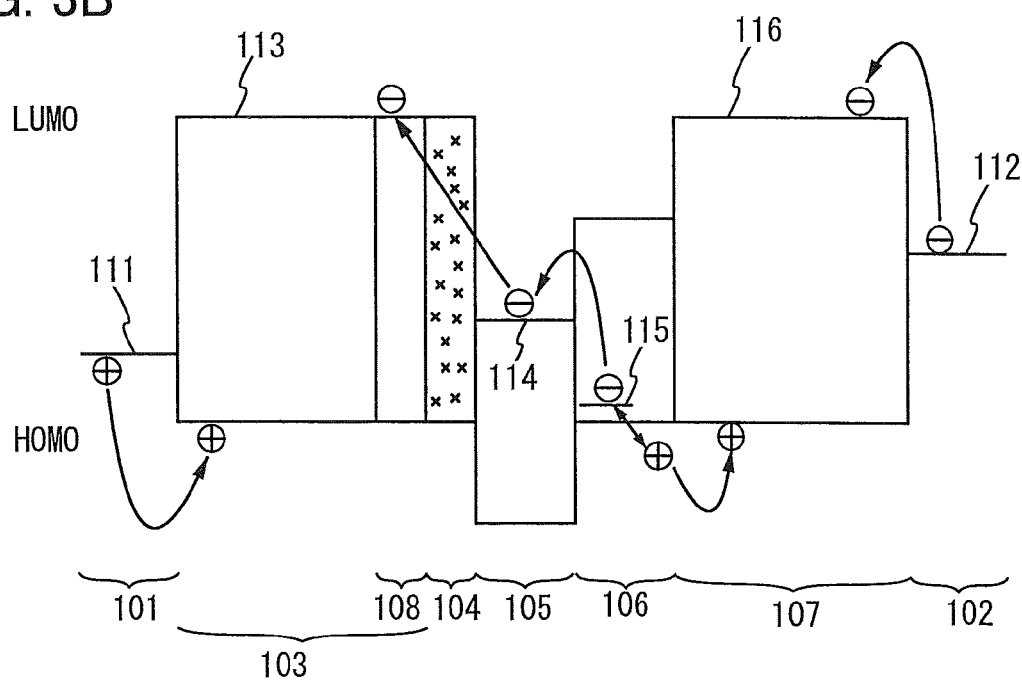

As illustrated in FIG. 3A, in a light-emitting element described in this embodiment, the first EL layer 103 and the second EL layer 107 each including a light-emitting region are interposed between a pair of electrodes (i.e., the anode 101 and the cathode 102), and between the first EL layer 103 and the second EL layer 107, the electron-injection buffer 104, the electron-relay layer 105, and the charge-generation layer 106 are stacked in this order over the anode 101. In addition, the electron-injection buffer 104 contains a substance having high electron-transport properties and a donor substance.

Note that, in this embodiment, it is preferable that the donor substance be added so that the mass ratio of the donor substance to the substance having high electron-transport properties is from 0.001:1 to 0.1:1. Accordingly, the electron-injection buffer 104 can have high film quality and high reactivity.

The anode 101, the cathode 102, the EL layer 103, the charge-generation layer 106, and the electron-relay layer 105 in Embodiment 3 can be formed using materials similar to those described in Embodiment 1.

In this embodiment, as the substance having high electron-transport properties used for the electron-injection buffer 104, the following can be used, for example: a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), or bis(2-methyl-8-quinolinolato)(4-phenylphenolato)aluminum (abbreviation: BAlq), or the like. Besides, a metal complex having an oxazole-based or thiazole-based ligand, such as bis[2-(2-hydroxyphenyl)benzoxazolato]zinc (abbreviation: Zn(BOX)$_2$) or bis[2-(2-hydroxyphenyl)-benzothiazolato] zinc (abbreviation: Zn(BTZ)$_2$), or the like can be used. Besides the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]carbazole (abbreviation: CO11), 3-(4-biphenylyl)-4-phenyl-5-(4-tert-biphenylyl)-1,2,4-triazole (abbreviation: TAZ), bathophenanthroline (abbreviation: BPhen), bathocuproine (abbreviation: BCP), or the like can be used. The substances described here are mainly substances having an electron mobility of greater than or equal to $10^{-6}$ cm$^2$/s.

Besides the above-described substances, a high molecular compound such as poly[(9,9-dihexylfluorene-2,7-diyl)-co-(pyridine-3,5-diyl)] (abbreviation: PF-Py) and poly[(9,9-dioctylfluorene-2,7-diyl)-co-(2,2'-bipyridine-6,6'-diyl)] (abbreviation: PF-BPy) can be used.

Further, in this embodiment, as the donor substance used for the electron-injection buffer 104, an alkali metal, an alkaline earth metal, a rare earth metal, a compound thereof (e.g., an alkali metal compound (e.g., an oxide such as lithium oxide, a halide, or carbonate such as lithium carbonate or cesium carbonate), an alkaline earth metal compound (e.g., an oxide, a halide, or carbonate), a rare earth metal compound (e.g., an oxide, a halide, or carbonate)), or the like can be used. Besides, an organic compound such as tetrathianaphthacene (abbreviation: TTN), nickelocene, or decamethylnickelocene can be used. Further, the substance used for forming the electron-injection buffer 104 can partly exist in the electron-relay layer 105 as well.

Note that in this embodiment, in the first EL layer 103, the electron-transport layer 108 may be formed in contact with the electron-injection buffer 104, and that in the case where the electron-transport layer 108 is formed, the substance having high electron-transport properties used for the electron-injection buffer 104 and a substance having high electron-transport properties used for the electron-transport layer 108 that is part of the EL layer 103 may be the same or different.

As illustrated in FIG. 3A, the light-emitting element described in this embodiment has a feature in that the electron-injection buffer 104 containing the substance having a high electron-transport properties and the donor substance is formed between the EL layer 103 and the electron-relay layer 105. FIG. 3B is a band diagram of this element structure.

In other words, the electron-injection buffer 104 is formed, whereby the injection barrier between the electron-relay layer 105 and the first EL layer 103 can be reduced; thus, electrons generated in the charge-generation layer 106 can be easily injected into the first EL layer 103. In addition, holes generated in the charge-generation layer 106 move to the second EL layer 107.

Note that the structure described in this embodiment can be combined with any of the structures described in other embodiments as appropriate.

Embodiment 4

In Embodiment 4, another example of a light-emitting element included in the basic structure described in Embodiment 1 will be described with reference to FIGS. 12A and 12B.

Figure 12A:
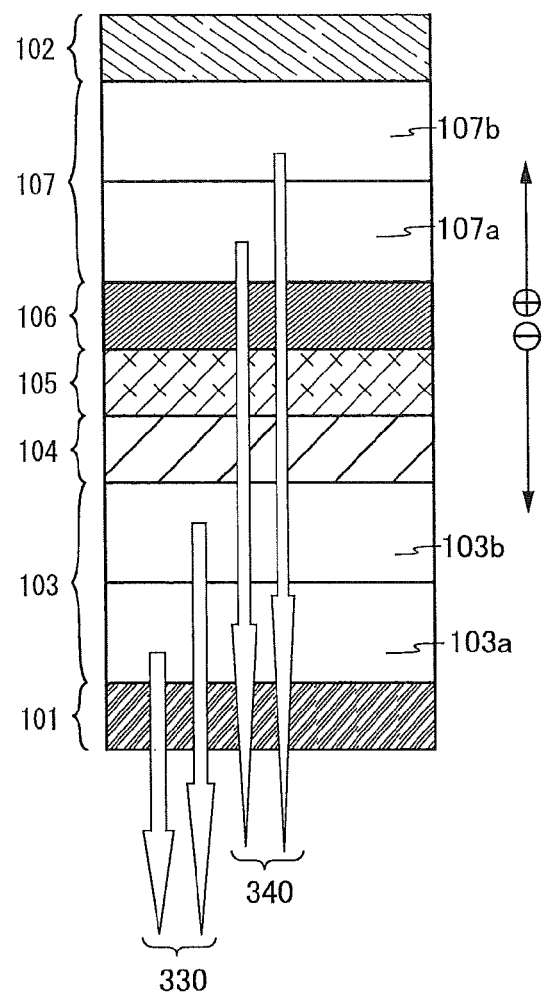
FIGS. 12A and 12B are a view illustrating an example of an element structure of a light-emitting element and a graph showing emission spectra, respectively.

As illustrated in FIG. 12A, a light-emitting element described in this embodiment has a structure in which the first EL layer 103 and the second EL layer 107 each including a light-emitting region are interposed between a pair of electrodes (i.e., the anode 101 and the cathode 102), and between the first EL layer 103 and the second EL layer 107, the electron-injection buffer 104, the electron-relay layer 105, and the charge-generation layer 106 are stacked in this order over the anode 101.

The anode 101, the cathode 102, the electron-injection buffer 104, the electron-relay layer 105, and the charge-generation layer 106 in this embodiment can be formed using materials similar to those described in Embodiment 1.

In this embodiment, the first EL layer 103 includes a first light-emitting layer 103a which exhibits an emission spectrum having a peak in the blue to blue-green wavelength range and a second light-emitting layer 103b which exhibits an emission spectrum having a peak in the yellow to orange wavelength range. Further, the second EL layer 107 includes a third light-emitting layer 107a which exhibits an emission spectrum having a peak in the blue-green to green wavelength range and a fourth light-emitting layer 107b which exhibits an emission spectrum having a peak in the orange to red wavelength range. Note that the first light-emitting layer 103a and the second light-emitting layer 103b may be stacked in reverse order. Note also that the third light-emitting layer 107a and the fourth light-emitting layer 107b may be stacked in reverse order.

When the anode 101 side is positively biased and the cathode 102 side is negatively biased in such a light-emitting element, holes injected from the anode 101 and electrons generated in the charge-generation layer 106 and injected through the electron-relay layer 105 and the electron-injection buffer 104 are recombined in the first light-emitting layer 103a or the second light-emitting layer 103b, whereby first light emission 330 is obtained. Furthermore, electrons injected from the cathode 102 and holes generated in the charge-generation layer 106 are recombined in the third light-emitting layer 107a or the fourth light-emitting layer 107b, whereby second light emission 340 is obtained.

Figure 12B:
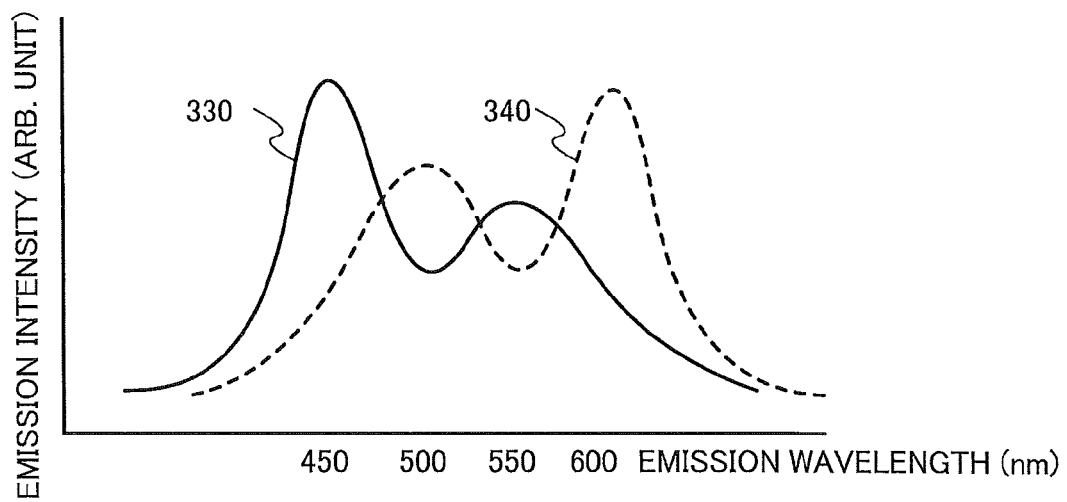

The first light emission 330 is a combination of light emission from both the first light-emitting layer 103a and the second light-emitting layer 103b; thus, as shown in FIG. 12B, the first light emission 330 exhibits an emission spectrum having peaks in both the wavelength range of blue to blue-green and the wavelength range of yellow to orange.

In other words, the first EL layer 103 exhibits light emission of a 2-wavelength-type white color or a 2-wavelength-type color that is close to white. Further, the second light emission 340 is a combination of light emission from both the third light-emitting layer 107a and the fourth light-emitting layer 107b; thus, as shown in FIG. 12B, the second light emission 340 exhibits an emission spectrum having peaks in both the wavelength range of blue-green to green and the wavelength range of orange to red. In other words, the second EL layer 107 exhibits light emission of 2-wavelength-type white color or a 2-wavelength-type color that is close to white, which is different from the light emission of the first EL layer 103.

Accordingly, light emission which covers the wavelength range of blue to blue-green, the wavelength range of blue-green to green, the wavelength range of yellow to orange, and the wavelength range of orange to red can be obtained by the light-emitting element in this embodiment, as a result of combining the first light emission 330 and the second light emission 340.

In this embodiment, even if, for example, the emission luminance of the first light-emitting layer 103a (which exhibits an emission spectrum having a peak in the wavelength range of blue to blue-green) deteriorates over time or changes due to current density, deviation of chromaticity is relatively small because the contribution of the first light-emitting layer 103a with respect to the entire spectrum is approximately one quarter.

Note that, although the example has been described in which the first EL layer 103 exhibits the spectrum having peaks in both the wavelength range of blue to blue-green and the wavelength range of yellow to orange, and the second EL layer 107 exhibits the spectrum having peaks in both the wavelength range of blue-green to green and the wavelength range of orange to red, the first EL layer 103 and the second EL layer 107 each may exhibit the opposite spectrum. In other words, a structure may be employed in which the second EL layer 107 exhibits the spectrum having peaks in both the wavelength range of blue to blue-green and the wavelength range of yellow to orange, and the first EL layer 103 exhibits the spectrum having peaks in both the wavelength range of blue-green to green and the wavelength range of orange to red. In addition, each of the first EL layer 103 and the second EL layer 107 may have a structure in which a light-emitting layer and layers other than the light-emitting layer are stacked.

Next, materials that can be used as a light-emitting organic compound for the EL layer of the light-emitting element described in this embodiment will be described. However, materials that can be applied to the light-emitting element described in this embodiment are not limited to those given below.

Blue to blue-green light emission can be obtained, for example, by using perylene, 2,5,8,11-tetra-t-butylperylene (abbreviation: TBP), 9,10-diphenylanthracene, or the like as a guest material, and dispersing the guest material in a suitable host material. The blue to blue-green light emission can also be obtained from a styrylarylene derivative such as 4,4'-bis(2,2-diphenylvinyl)biphenyl (abbreviation: DPVBi), or an anthracene derivative such as 9,10-di-2-naphthylanthracene (abbreviation: DNA) or 9,10-bis(2-naphthyl)-2-t-butylanthracene (abbreviation: t-BuDNA). A polymer such as poly(9,9-dioctylfluolene) may also be used. Further, as a guest material for blue light emission, a styrylamine derivative is preferable. As examples of the styrylamine derivative, N,N'-bis[4-(9H-carbazol-9-yl)phenyl]-N,N'-diphenylstilbene-4,4'-diamine (abbreviation: YGA2S), N,N'-diphenyl-N,N'-bis(9-phenyl-9H-carbazol-3-yl)stilbene-4,4'-diamine (abbreviation: PCA2S), and the like can be given. In particular, YGA2S is preferable because it has a peak at around 450 nm. Further, as a host material, an anthracene derivative is preferable; 9,10-bis(2-naphthyl)-2-t-butylanthracene (abbreviation: t-BuDNA) and 9-[4-(10-phenyl-9-anthryl)phenyl]-9H-carbazole (abbreviation: CzPA) are preferable. In particular, CzPA is preferable because of its electrochemical stability.

Blue-green to green light emission can be obtained, for example, by using a coumarin dye such as coumarin 30 or coumarin 6; bis[2-(2,4-difluorophenyl)pyridinato]picolinatoiridium (abbreviation: FIrpic); bis(2-phenylpyridinato)acetylacetonatoiridium (abbreviation: Ir(ppy)$_2$(acac)); or the like as a guest material and dispersing the guest material in a suitable host material. The blue-green to green light emission can also be obtained by dispersing perylene or TBP given above in a suitable host material at a high concentration of greater than or equal to 5 wt %. The blue-green to green light emission can also be obtained from a metal complex such as BAlq, Zn(BTZ)$_2$, or bis(2-methyl-8-quinolinolato)chlorogallium (Ga(mq)$_2$Cl). A polymer such as poly (p-phenylenevinylene) may also be used. Further, an anthracene derivative is preferably used as a guest material of a blue-green to green light-emitting layer, in which case high luminous efficiency can be obtained. For example, when 9,10-bis {4-[4N-(4-diphenylamino)phenyl-N-phenyl]aminophenyl}-2-tert-butylanthracene (abbreviation: DPABPA) is used, highly efficient blue-green light emission can be obtained. Further, an anthracene derivative in which an amino group is substituted into the 2-position is preferably used, in which case highly efficient green light emission can be obtained. In particular, N-(9,10-diphenyl-2-anthryl)-N,9-diphenyl-9H-carbazol-3-amine (abbreviation: 2PCAPA) is suitable because of its long life. As a host material for those materials, an anthracene derivative is preferable; CzPA, which is given above, is preferable because of its electrochemical stability. Further, in the case of manufacturing a light-emitting element which has two peaks in the wavelength range of blue to green is manufactured by combining green light emission with blue light emission, an anthracene derivative having electron-transport properties, such as CzPA, is preferably used as a host material for a blue light-emitting layer and an aromatic amine compound having high hole-transport properties, such as NPB is preferably used as a host material for a green light-emitting layer, in which case light emission can be obtained at an interface between the blue light-emitting layer and the green light-emitting layer. In other words, in such a case, an aromatic amine compound such as NPB is preferable as a host material for a green light-emitting material such as 2PCAPA.

Yellow to orange light emission can be obtained, for example, by using rubrene, 4-(dicyanomethylene)-2-[p-(dimethylamino)styryl]-6-methyl-4H-pyran (abbreviation: DCM1), 4-(dicyanomethylene)-2-methyl-6-(9-julolidyl)ethenyl-4H-pyran (abbreviation: DCM2), bis[2-(2-thienyl)pyridinato]acetylacetonatoiridium (abbreviation: Ir(thp)$_2$(acac)), bis(2-phenylquinolinato)acetylacetonatoiridium (abbreviation: Ir(pq)$_2$(acac)), or the like as a guest material and dispersing the guest material in a suitable host material. In particular, a tetracene derivative such as rubrene is preferable as a guest material because of its high efficiency and chemical stability. As a host material in that case, an aromatic amine compound such as NPB is preferable. As another host material, a metal complex such as bis(8-quinolinolato)zinc (abbreviation: Znq2), bis[2-cinnamoyl-8- quinolinolato]zinc (abbreviation: $Znsq_2$), or the like can be used as a host material. Further alternatively, a polymer such as poly(2,5-dialkoxy-1,4-phenylenevinylene) may be used.

Orange to red light emission can be obtained, for example, by using 4-(dicyanomethylene)-2,6-bis[p-(dimethylamino)styryl]-4H-pyran (abbreviation: BisDCM), 4-(dicyanomethylene)-2,6-bis[2-(julolidin-9-yl)ethynyl]-4H-pyran (abbreviation: DCM1), 4-(dicyanomethylene)-2-methyl-6-(9-julolidyl)ethenyl-4H-pyran (abbreviation: DCM2), bis[2-(2-thienyl)pyridinato]acetylacetonatoiridium (abbreviation: $Ir(thp)_2(acac)$), or the like as a guest material and dispersing the guest material in a suitable host material. The orange to red light emission can also be obtained from a metal complex such as bis(8-quinolinolato)zinc (abbreviation: $Znq_2$) or bis[2-cinnamoyl-8-quinolinolato) zinc (abbreviation: $Znsq_2$). A polymer such as poly(3-alkylthiophene) may also be used. As a guest material which exhibits red light emission, a 4H-pyran derivative such as 4-(dicyanomethylene)-2,6-bis[p-(dimethylamino)styryl]-4H-pyran (abbreviation: BisDCM), 4-(dicyanomethylene)-2,6-bis[2-(julolidin-9-yl)ethynyl]-4H-pyran (abbreviation: DCM1), 4-(dicyanomethylene)-2-methyl-6-(9-julolidyl)ethynyl-4H-pyran (abbreviation: DCM2), {2-isopropyl-6-[2-(2,3,6,7-tetrahydro-1,1,7,7-tetramethyl-1H,5H-benzo[ij]quinolizin-9-yl)ethenyl]-4H-pyran-4-ylidene}propanedinitrile (abbreviation: DCJTI), or {2,6-bis[2-(2,3,6,7-tetrahydro-8-methoxy-1,1,7,7-tetramethyl-1H,5H-benzo[ij]quinolizin-9-yl)ethenyl]-4H-pyran-4-ylidene}propanedinitrile (abbreviation: BisDCJTM) is preferable because of its high efficiency. In particular, DCJTI and BisDCJTM are preferable because they have a light emission peak at around 620 nm.

As a suitable host material in the above-described structures, a host material which has a shorter wavelength than the light-emitting organic compound or a host material which has a large energy gap is preferably used. Specifically, a hole-transport material or an electron-transport material typified by the examples given in Embodiment 1 can be selected as appropriate. Also, 4,4'-bis(N-carbazolyl)-biphenyl (abbreviation: CBP), 4,4',4''-tris(N-carbazolyl)triphenylamine (abbreviation: TCTA), 1,3,5-tris[4-(N-carbazolyl)phenyl]benzene (abbreviation: TCPB), or the like may be used.

White light emission which covers the wavelength range of blue to blue-green, the wavelength range of blue-green to green, the wavelength range of yellow to orange, and the wavelength range of orange to red can be obtained by the light-emitting element described in this embodiment, as a result of combining the emission spectrum of the first EL layer and the emission spectrum of the second EL layer.

Note that light may be made more like natural light having a continuous emission spectrum in such a manner that the thickness of each stacked layer is adjusted and slight interference of light is deliberately caused so that generation of a projected sharp peak is suppressed and a trapezoidal emission spectrum is obtained. In addition, the position of a peak of an emission spectrum can also be changed by adjusting the thickness of each stacked layer and intentionally causing slight interference of light. By adjusting the thickness of each stacked layer so that a plurality of peak intensities which appear in an emission spectrum are made substantially the same and by decreasing the intervals between the peaks, white light emission having an emission spectrum which is closer to a trapezoidal shape can be obtained.

Note that in this embodiment, the EL layer is described in which in each of the plurality of light-emitting layers, emission colors that are complementary colors are combined to obtain white light emission. A specific structure of an EL layer which exhibits white light emission by the relationship of complementary colors will be described below.

The EL layer provided in the light-emitting element described in this embodiment has a structure in which, for example, a first layer containing a substance having high hole-transport properties and a first light-emitting substance; a second layer containing a substance having high hole-transport properties and a second light-emitting substance; and a third layer containing a substance having high electron-transport properties and the second light-emitting substance are stacked in this order over the anode 101.

Both the first light-emitting substance and the second light-emitting substance need to emit light in order that white light emission is obtained in the EL layers of the light-emitting element described in this embodiment. Thus, in order to adjust the transport properties of carriers in the EL layers, both the substance having high electron-transport properties and the substance having high electron-transport properties are preferably used as host materials. Note that as the substance having high electron-transport properties and the substance having high electron-transport properties which can be used for the EL layers, the substances given as examples in Embodiment 1 can be used as appropriate.

Further, as the first light-emitting substance and the second light-emitting substance, substances emitting light of colors that are complementary colors can be selected. As for the complementary colors, color combinations of blue and yellow, blue-green and red, and the like can be given. A substance which emits blue, yellow, blue-green, or red light may be selected as appropriate from, for example, the light-emitting substances given above. Note that the emission wavelength of the second light-emitting substance is made to be shorter than the emission wavelength of the first light-emitting substance, whereby part of excitation energy of the second light-emitting substance is transferred to the first light-emitting substance, so that the first light-emitting substance can be made to emit light. Thus, in the light-emitting element of this embodiment, the emission peak wavelength of the second light-emitting substance is preferably shorter than the emission peak wavelength of the first light-emitting substance.

In the structure of the light-emitting element described in this embodiment, both light emission from the first light-emitting substance and light emission from the second light-emitting substance can be obtained, and the emission color of the first light-emitting substance and the emission color of the second light-emitting substance are complementary colors, and thus white light emission can be obtained. In addition, the structure of the light-emitting element described in this embodiment is employed, whereby a light-emitting element with a long life can be obtained.

Note that the structure described in this embodiment can be combined with any of the structures described in other embodiments as appropriate.

Embodiment 5

Figure 4A:
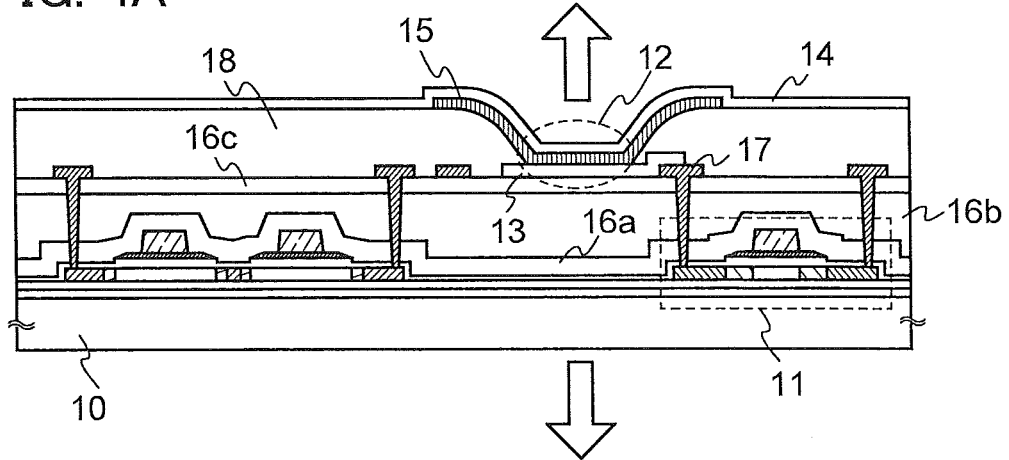
FIGS. 4A to 4C are views illustrating active matrix light-emitting devices.
Figure 4B:
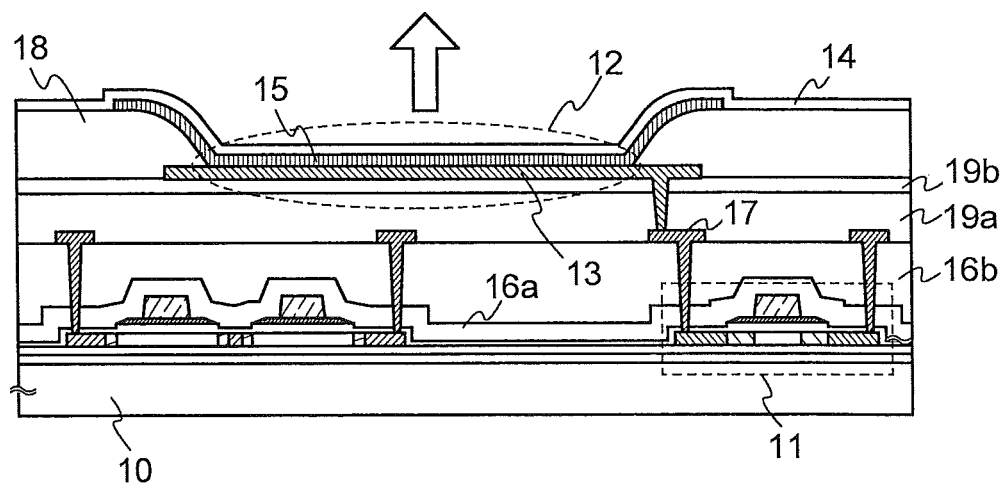
Figure 4C:
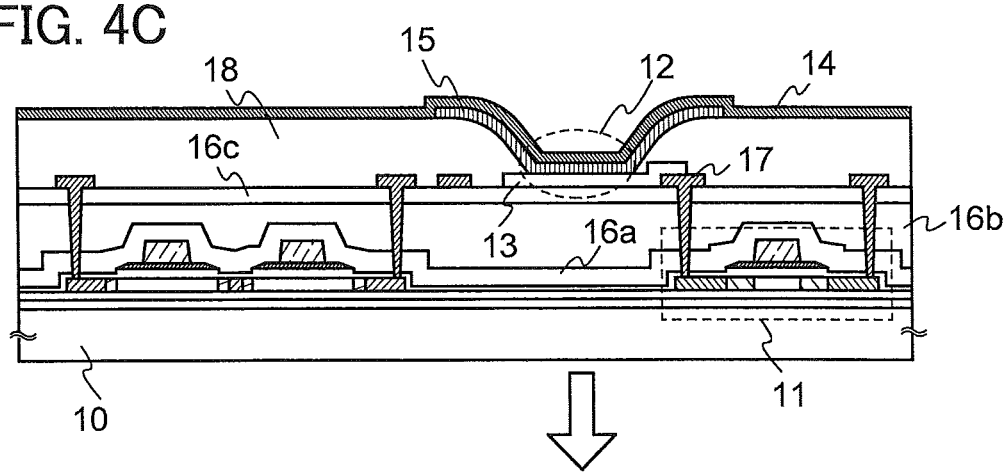

In Embodiment 5, one embodiment of a light-emitting device including the light-emitting element described in any of the above embodiments will be described with reference to FIGS. 4A to 4C. FIGS. 4A to 4C are cross-sectional views of light-emitting devices.

In each of FIGS. 4A to 4C, a portion surrounded by a rectangle of dotted lines corresponds to a transistor 11 which is provided for driving a light-emitting element 12. The light-emitting element 12 includes a layer 15 containing an organic compound between a first electrode 13 and a second electrode 14. The layer containing an organic compound includes n (n is a natural number of two or more) EL layers, where between the m-th (in is a natural number, $1 \leq m \leq n-1$) EL layer and the (m+1)-th EL layer, an electron-injection buffer, an electron-relay layer, and a charge-generation layer are provided in this order over an anode. Further, in each of the EL layers, at least a light-emitting layer is provided, and a hole-injection layer, a hole-transport layer, an electron-transport layer, or an electron-injection layer is provided as appropriate in addition to the light-emitting layer. In other words, the light-emitting element 12 has a structure similar to the one described in any of Embodiments 1 to 4. A drain region of the transistor 11 is electrically connected to the first electrode 13 by a wiring 17 penetrating a first interlayer insulating film 16 (16a, 16b, and 16c). The light-emitting element 12 is separated from other light-emitting elements that are provided adjacent to the light-emitting element 12 by a partition layer 18. The light-emitting device of this embodiment having such a structure is provided over a substrate 10 in this embodiment.

The transistor 11 illustrated in each of FIGS. 4A to 4C is a top-gate type transistor in which a gate electrode is provided on the opposite side to the substrate with a semiconductor layer interposed between the substrate and the gate electrode. However, there is no particular limitation on the structure of the transistor 11; for example, the transistor 11 may be of bottom-gate type. In the case where the transistor 11 is of bottom-gate type, the transistor 11 may have a structure in which a protective film is formed over the semiconductor layer used to form a channel (a channel protective type) or a structure in which part of the semiconductor layer used to form a channel has a depression (a channel etch type). Note that reference numeral 21 denotes a gate electrode; 22, a gate insulating film; 23, a semiconductor layer; 24, an n-type semiconductor layer; 25, an electrode; and 26, a protective film.

Further, the semiconductor layer included in the transistor 11 may be either crystalline or non-crystalline. Alternatively, a microcrystalline semiconductor, an oxide semiconductor, or the like may be used.

For the oxide semiconductor layer, a composite oxide of an element selected from indium, gallium, aluminum, zinc, and tin can be used. For example, zinc oxide (ZnO), indium oxide containing zinc oxide (IZO), and oxide containing indium oxide, gallium oxide, and zinc oxide (IGZO) can be given. As a specific example of the crystalline semiconductor layer, a layer formed of single crystal or polycrystalline silicon, silicon germanium, or the like can be given. It may be formed by laser crystallization or may be formed by crystallization through a solid phase growth method using, for example, nickel.

In the case where the semiconductor layer is formed using an amorphous substance, for example, amorphous silicon, it is preferable that the light-emitting device have a circuit in which the transistor 11 and other transistors (transistors constituting a circuit for driving the light-emitting element) are all n-channel transistors. Further, many oxide semiconductors, for example, zinc oxide (ZnO), indium oxide containing zinc oxide (IZO), oxide containing indium oxide, gallium oxide, and zinc oxide (IGZO), are n-type semiconductors; thus, a transistor in which any of those compounds is contained in an active layer is an n-channel transistor. In a case other than the above, a light-emitting device may have a circuit including either an n-channel transistor or a p-channel transistor, or may have a circuit including both an n-channel transistor and a p-channel transistor.

Further, the first interlayer insulating film 16 may be a multilayer as illustrated in FIGS. 4A and 4C, or may be a single layer. Note that the first interlayer insulating film 16a is formed of an inorganic material such as silicon oxide or silicon nitride; the first interlayer insulating film 16b is formed of acrylic, siloxane (an organic group including a skeleton of a silicon-oxygen bond (Si—O bond) and containing at least hydrogen as a substituent), or a self-planarizing substance which can be formed as a film by an application method, such as silicon oxide. In addition, the first interlayer insulating film 16c is formed of a silicon nitride film containing argon (Ar). Note that there is no particular limitation on the substance forming each layer, and a substance other than the above substances may also be used. A layer formed using a substance other than the above substances may be further combined. As described above, the first interlayer insulating films 16a to 16c may be formed using both an inorganic material and an organic material, or using either an inorganic film or an organic film.

As for the partition layer 18, the radius of curvature of the edge portion preferably changes continuously. In addition, the partition layer 18 is formed using acrylic, siloxane, resist, silicon oxide, or the like. Note that the partition layer 18 may be formed using either an inorganic film or an organic film, or both of them.

Note that, although the structure in which only the first interlayer insulating films 16a to 16c are provided between the transistor 11 and the light-emitting element 12 is illustrated in each of FIGS. 4A and 4C, the structure illustrated in FIG. 4B may be employed in which a second interlayer insulating film 19 (19a and 19b) is provided in addition to the first interlayer insulating film 16 (16a and 16b). In the light-emitting device illustrated in FIG. 4B, the first electrode 13 penetrates the second interlayer insulating film 19 to be connected to the wiring 17.

The second interlayer insulating film 19 may be a multilayer like the first interlayer insulating film 16 or may be a single layer. The second interlayer insulating film 19a is formed of acrylic, siloxane (an organic group including a skeleton of a silicon-oxygen bond (Si—O bond) and containing at least hydrogen as a substituent), or a self-planarizing substance which can be formed as a film by an application method, such as silicon oxide. The second interlayer insulating film 19b is formed of a silicon nitride film containing argon (Ar). Note that there is no particular limitation on the substance forming each layer, and a substance other than the above substances may also be used. A layer formed of a substance other than the above substances may be further combined. As described above, the second interlayer insulating films 19a and 19b may be formed using both an inorganic material and an organic material, or using either an inorganic film or an organic film.

In the case where both the first electrode and the second electrode in the light-emitting element 12 are formed using a light-transmitting substance, emitted light can be extracted through both the first electrode 13 and the second electrode 14 as indicated by outline arrows in FIG. 4A. In addition, in the case where only the second electrode 14 is formed using a light-transmitting substance, emitted light can be extracted through only the second electrode 14 as indicated by an outline arrow in FIG. 4B. In that case, the first electrode 13 is preferably formed using a material having high reflectivity, or a film formed using a material having high reflectivity (a reflective film) is preferably provided below the first electrode 13. Furthermore, in the case where only the first electrode 13 is formed using a light-transmitting substance, emitted light can be extracted through only the first electrode 13 as indicated by an outline arrow in FIG. 4C. In that case, the second electrode 14 is preferably formed using a material having high reflectivity, or a reflective film is preferably formed above the second electrode 14.

Further, in the light-emitting element 12, the layer 15 may be stacked so that the light-emitting element 12 operates when voltage is applied so that the potential of the second electrode 14 becomes higher than that of the first electrode 13, or the layer 15 may be stacked so that the light-emitting element 12 operates when voltage is applied so that the potential of the second electrode 14 becomes lower than that of the first electrode 13. In the former case, the transistor 11 is an n-channel transistor, while in the latter case, the transistor 11 is a p-channel transistor.

Note that, although only one light-emitting element is illustrated in each of the cross-sectional views of FIGS. 4A to 4C, a plurality of light-emitting elements are arranged in matrix in a pixel portion. Further, in the case where color display of color components, R (red), G (green), and B (blue), is performed, a plurality of light-emitting elements which provide three kinds of light emissions (R, G, and B) are formed in the pixel portion. In addition, the color components are not limited to three colors, and color components of four colors or more may be used or a color other than R, G, and B may be used. For example, white may be added so that R, G, B, and W (W means white) can be used.

As a manufacturing method of light-emitting elements of different color components, the following method can be used: a method in which EL layers of different colors are separately arranged; a method in which all EL layers are formed so as to emit white light and the EL layers are combined with color filters, whereby light-emitting elements of different color components are obtained; a method in which all EL layers are formed so as to emit blue light or light with a shorter wavelength than blue light and the EL layers are combined with color conversion layers, whereby light-emitting elements of different color components are obtained; or the like.

Figure 5A:
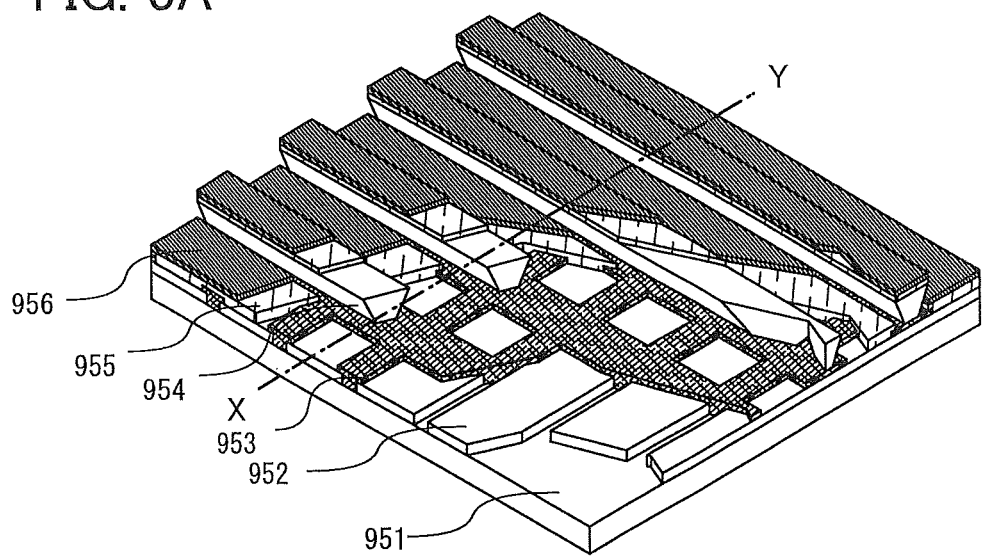
FIGS. 5A and 5B are views illustrating a passive matrix light-emitting device.

As described above, in this embodiment, an active matrix light-emitting device in which the driving of the light-emitting element is controlled by the transistor is described. However, a passive matrix light-emitting device in which a light-emitting element is driven without providing an element for driving, such as a transistor, over the same substrate as the light-emitting element may be employed. FIG. 5A is a perspective view of a passive matrix light-emitting device manufactured by application of the light-emitting element described in any of Embodiments 1 to 4. In addition, FIG. 5B is a cross-sectional view taken along a dashed line X-Y of FIG. 5A.

Figure 5B:
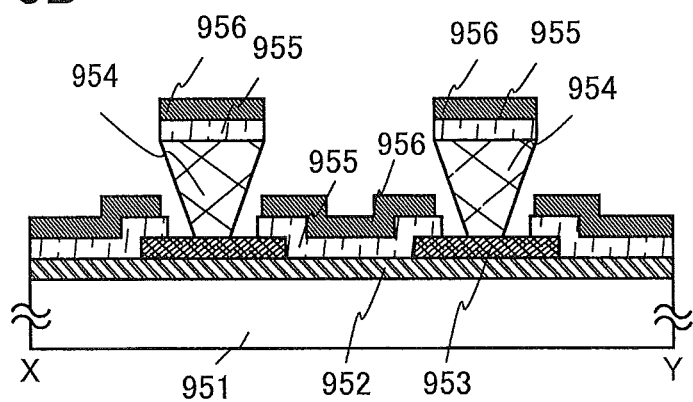

In FIGS. 5A and 5B, over a substrate 951, a layer 955 containing an organic compound is provided between an electrode 952 and an electrode 956. The layer containing an organic compound includes n (n is a natural number of two or more) EL layers, where between the m-th (m is a natural number, 1≤m≤n−1) EL layer and the (m+1)-th EL layer, an electron-injection buffer, an electron-relay layer, and a charge-generation layer are provided in this order over an anode. Further, in each of the EL layers, at least a light-emitting layer is provided, and a hole-injection layer, a hole-transport layer, an electron-transport layer, or an electron-injection layer is provided as appropriate in addition to the light-emitting layer. End portions of the electrode 952 are covered with an insulating layer 953. Then, a partition layer 954 is provided over the insulating layer 953. The partition layer 954 preferably has tapered sidewalls with such a slope that the distance between opposite sidewalls decreases toward the substrate surface. In other words, a cross section of the partition layer 954 in the direction of a narrow side is trapezoidal, and a base (a side facing in a similar direction to a plane direction of the insulating layer 953 and being in contact with the insulating layer 953) is shorter than an upper side (a side facing in a similar direction to the plane direction of the insulating layer 953 and not being in contact with the insulating layer 953). The partition layer 954 is provided in this manner, whereby a defect of the light-emitting element due to static electricity or the like can be prevented. The passive matrix light-emitting device can also be driven with low power consumption when it includes the light-emitting element described in any of Embodiments 1 to 4.

The light-emitting element described as an example in any of the above embodiments is used in the light-emitting device described in this embodiment; thus, the light-emitting device can have high luminance, can be driven at low voltage, and consumes less power.

Embodiment 6

In Embodiment 6, electronic devices each of which includes, as part thereof, the light-emitting device described in Embodiment 5 will be described. Electronic devices described in Embodiment 6 each include a display portion which includes the light-emitting element described in any of Embodiments 1 to 4, has high luminance, is driven at low voltage, and consumes less power.

As examples of the electronic devices of this embodiment, the following can be given: cameras such as video cameras and digital cameras, goggle type displays, navigation systems, audio replay devices (e.g., car audio systems and audio systems), computers, game machines, portable information terminals (e.g., mobile computers, cellular phones, portable game machines, and electronic book readers), image replay devices in which a recording medium is provided (specifically, devices that are capable of replaying recording media, such as digital versatile discs (DVDs), and equipped with a display device that can display an image), and the like. Specific examples of those electronic devices are illustrated in FIGS. 6A to 6E.

Figure 6A:
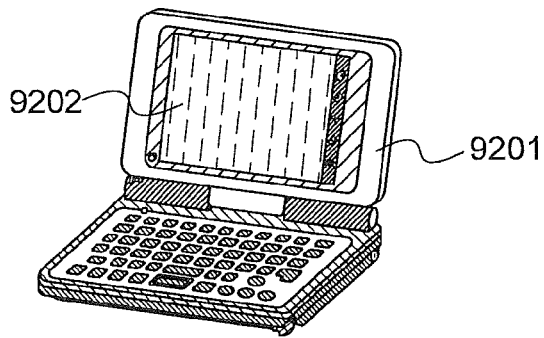
FIGS. 6A to 6E are diagrams illustrating electronic devices.

FIG. 6A illustrates an example of a portable information terminal device. A portable information terminal device 9200 incorporates a computer and therefore can process a variety of types of data. As an example of the portable information terminal device 9200, a personal digital assistance (PDA) can be given.

The portable information terminal device 9200 has two housings: a housing 9201 and a housing 9203. The housing 9201 and the housing 9203 are joined with a joining portion 9207 such that the portable information terminal device 9200 can be foldable. A display portion 9202 is incorporated in the housing 9201, and the housing 9203 is provided with a keyboard 9205. Needless to say, the structure of the portable information terminal device 9200 is not limited to the one described above, and the portable information terminal device 9200 may be provided with an additional accessory as appropriate. In the display portion 9202, light-emitting elements similar to those described in any of the above embodiments are arranged in matrix. The light-emitting elements have features of high luminance, low driving voltage, and low power consumption. The display portion 9202 including those light-emitting elements has features similar to those of the light-emitting elements; thus, lower power consumption of this portable information terminal device can be achieved.

Figure 6B:
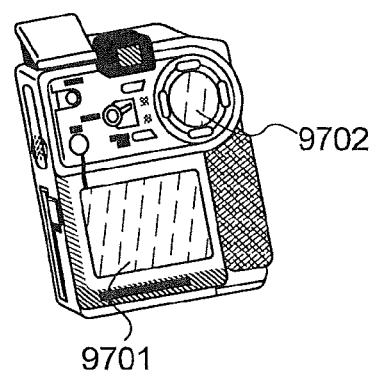

FIG. 6B illustrates an example of a digital video camera according to this embodiment. A digital video camera 9500 includes a display portion 9503 incorporated in a housing 9501 and various operation portions. Note that the structure of the digital video camera 9500 is not particularly limited and the digital video camera 9500 may be provided with an additional accessory as appropriate.

In this digital video camera, the display portion 9503 includes light-emitting elements similar to those described in any of the above embodiments, which are arranged in matrix. The light-emitting elements have features of low driving voltage, high luminance, and low power consumption. The display portion 9503 including those light-emitting elements has features similar to those of the light-emitting elements; thus, low power consumption of this digital video camera can be achieved.

Figure 6C:
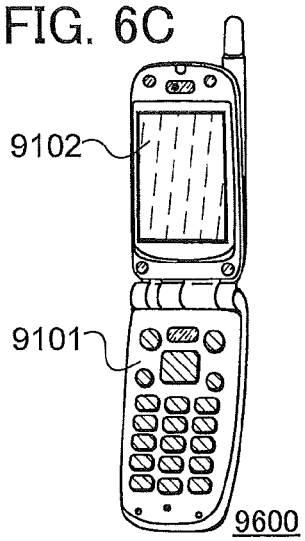

FIG. 6C illustrates an example of a cellular phone according to this embodiment. A cellular phone 9100 has two housings: a housing 9101 and a housing 9102. The housing 9101 and the housing 9102 are joined with a joining portion 9103 such that the cellular phone can be foldable. A display portion 9104 is incorporated in the housing 9102, and the housing 9101 is provided with operation keys 9106. Note that the structure of the cellular phone 9100 is not particularly limited and the cellular phone 9100 may be provided with an additional accessory as appropriate.

In this cellular phone, the display portion 9104 includes light-emitting elements similar to those described in any of the above embodiments, which are arranged in matrix. The light-emitting elements have features of high luminance, low driving voltage, and low power consumption. The display portion 9104 including those light-emitting elements has features similar to those of the light-emitting elements; thus, lower power consumption of this cellular phone can be achieved. As a backlight of a display provided for a cellular phone or the like, the light-emitting element described in any of the above embodiments may be used.

Figure 6D:
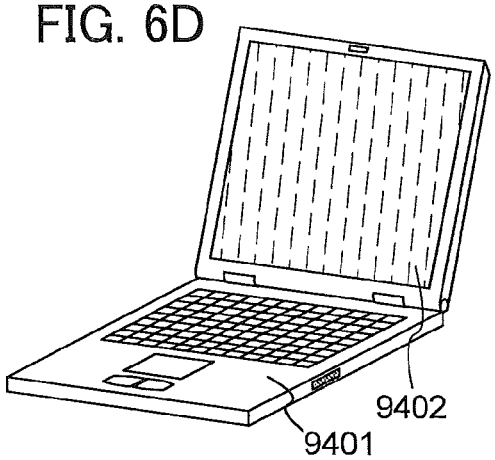

FIG. 6D illustrates an example of a portable computer. A computer 9400 has two housings: a housing 9401 and a housing 9404 that are joined such that the computer 9400 can be opened and closed. A display portion 9402 is incorporated in the housing 9404, and the housing 9401 is provided with a keyboard 9403 and the like. Note that the structure of the computer 9400 is not particularly limited and the computer 9400 may be provided with an additional accessory as appropriate.

In this computer, the display portion 9402 includes light-emitting elements similar to those described in the any of above embodiments, which are arranged in matrix. The light-emitting elements have features of high luminance, low driving voltage, and low power consumption. The display portion 9402 including those light-emitting elements has features similar to those of the light-emitting elements; thus, lower power consumption of this computer can be achieved.

Figure 6E:
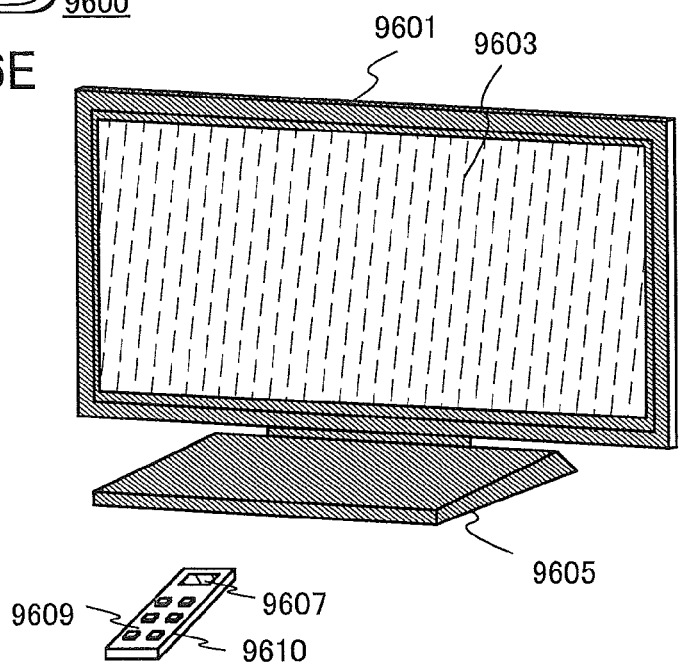

FIG. 6E illustrates an example of a television set. In a television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels can be selected and volume can be controlled with operation keys 9609 of the remote controller 9610, whereby images displayed on the display portion 9603 can be controlled. Furthermore, the remote controller 9610 may be provided with a display portion 9607 for displaying information outputted from the remote controller 9610.

Note that the television set 9600 is provided with a receiver, a modem, and the like. With the use of the receiver, a general television broadcast can be received. Moreover, when the television set is connected to a communication network with or without wires via the modem, one-way (from a sender to a receiver) or two-way (between a sender and a receiver or between receivers) information communication can be performed.

In at least one of the display portion 9603 and the display portion 9607 of this television set, light-emitting elements similar to those described in any of the above embodiments are arranged in matrix. The light-emitting elements have features of high luminance, low driving voltage, and low power consumption. The display portion including those light-emitting elements has features similar to those of the light-emitting elements.

As described above, the application range of the light-emitting device described in the above embodiment is so wide that this light-emitting device can be applied to electronic devices in all fields. With the use of the light-emitting elements described in Embodiments 1 to 4, electronic devices having a low-power consumption display portion which exhibits high luminance emission can be provided.

Further, the light-emitting device described in the above embodiment can also be used as a lighting device. One embodiment in which the light-emitting device described in the above embodiment is used as a lighting device will be described with reference to FIG. 7.

Figure 7:
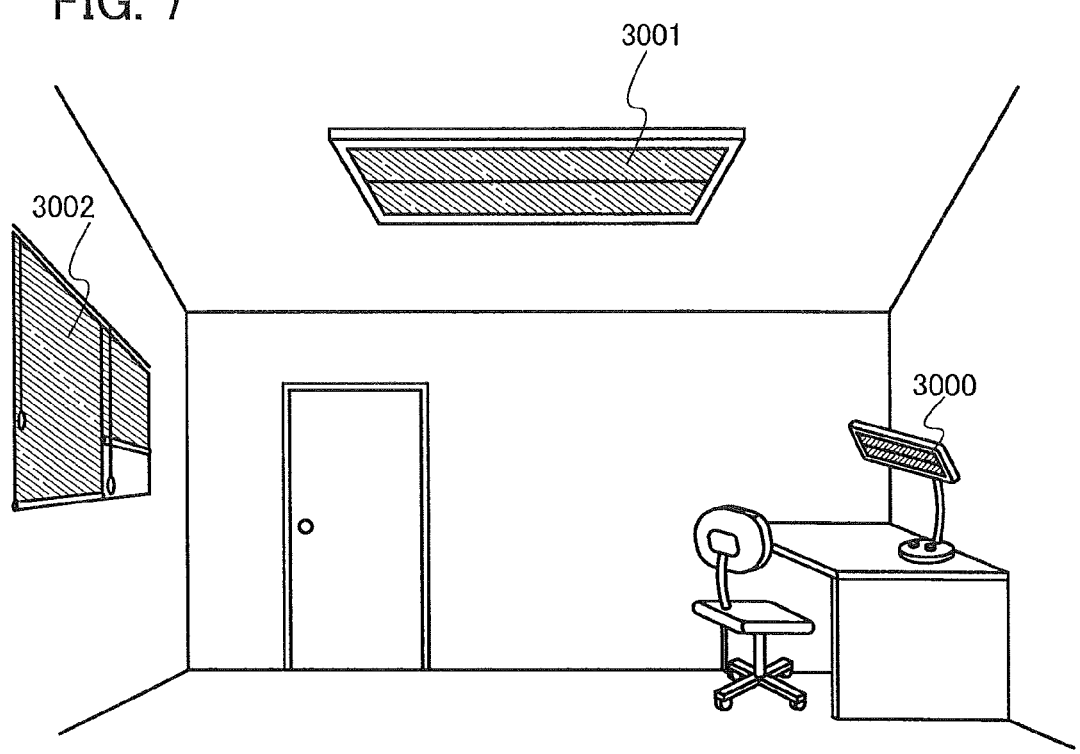
FIG. 7 is a diagram illustrating lighting devices.

FIG. 7 illustrates an example in which the light-emitting device, an example of which is described in the above embodiment, is used as a table lamp that is a lighting device and an interior lighting device. The table lamp illustrated in FIG. 7 includes a light source 3000. For the light source 3000, the light-emitting device, an example of which is described in the above embodiment is used. Thus, a low-power consumption light-emitting device can be obtained. Since this light-emitting device can have a larger area, the light-emitting device can be used as a lighting device having a large area. In addition, this light-emitting device is thin and consumes less power and therefore can be used as a lighting device which achieves reduction in thickness and power consumption of the lighting device. Moreover, this light-emitting device can be flexible and therefore can be used as, for example, a roll-type lighting device like a lighting device 3002. As described above in this embodiment, the television set described with reference to FIG. 6E can be placed in a room where the light-emitting device described in this embodiment is used as the indoor lighting devices 3001 and 3002.

As described above, the application range of the light-emitting device described in Embodiment 5 is so wide that the light-emitting device can be applied to electronic devices in all fields. Note that this embodiment can be combined with any of Embodiments 1 to 5 as appropriate.

Example 1

In Example 1, a light-emitting element that is one embodiment of the present invention will be described with reference to FIG. 8A. Chemical formulae of materials used in this example are shown below.

[Chemical Formula 1]

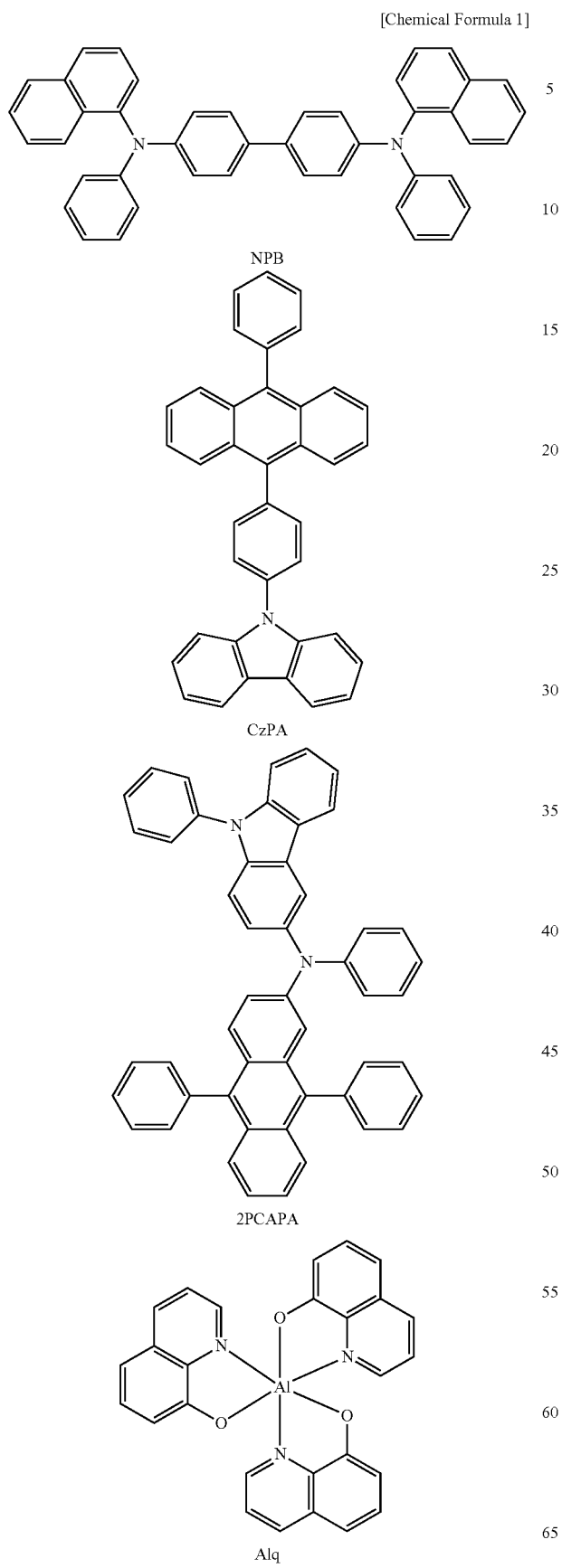

NPB

CzPA

2PCAPA

Alq

BPhen

PTCBI

Methods for manufacturing a light-emitting element 1, a comparative light-emitting element 1, and a comparative light-emitting element 2 will be described below.

First, the light-emitting element 1 will be described (see FIG. 8A). Indium tin oxide containing silicon oxide was deposited over a glass substrate 2100 by a sputtering method to form a first electrode 2101. The first electrode 2101 had a thickness of 110 nm and an area of 2 mm×2 mm.

Next, the substrate on which the first electrode 2101 was formed was fixed to a substrate holder provided in a vacuum evaporation apparatus in such a way that a surface of the substrate on which the first electrode 2101 was formed faced downward, and then the pressure was reduced to about $10^{-4}$ Pa. After that, 9-[4-(10-phenyl-9-anthryl)phenyl]-9H-carbazole (abbreviation: CzPA) that is a substance having high hole-transport properties and molybdenum(VI) oxide that is an acceptor substance were co-evaporated on the first electrode 2101 to form a first charge-generation layer 2103a containing a composite material of an organic compound and an inorganic compound. The thickness of the first charge-generation layer 2103a was 50 nm. The weight ratio of CzPA to molybdenum(VI) oxide was adjusted to be 4:2 (=CzPA:molybdenum oxide). Note that the co-evaporation method is an evaporation method in which evaporation is performed from a plurality of evaporation sources at the same time in one treatment chamber.

Next, NPB was deposited to a thickness of 10 nm on the first charge-generation layer 2103a by an evaporation method using resistance heating to form a hole-transport layer 2103b.

Furthermore, CzPA and N-(9,10-diphenyl-2-anthryl)-N,9-diphenyl-9H-carbazol-3-amine (abbreviation: 2PCAPA) were co-evaporated to form a light-emitting layer 2103c with a thickness of 30 nm on the hole-transport layer 2103b.

Here, the weight ratio of CzPA to 2PCAPA was adjusted to be 1:0.05 (=CzPA:2PCAPA). Note that CzPA is a substance having electron-transport properties and 2PCAPA that is a guest material is a substance exhibiting green light emission.

After that, by an evaporation method using resistance heating, Alq was evaporated to a thickness of 10 nm on the light-emitting layer 2103c, and then BPhen was evaporated to a thickness of 20 nm to be stacked thereon, whereby an electron-transport layer 2103d was formed. Thus, a first EL layer 2103 including the first charge-generation layer 2103a, the hole-transport layer 2103b, the light-emitting layer 2103c, and the electron-transport layer 2103d was formed.

Next, lithium oxide ($Li_2O$) was evaporated to a thickness of 0.1 nm on the electron-transport layer 2103d to form an electron-injection buffer 2104.

Next, 3,4,9,10-perylenetetracarboxylic-bis-benzimidazole (abbreviation: PTCBI) was evaporated to form an electron-relay layer 2105 with a thickness of 3 nm on the electron-injection buffer 2104. Note that the LUMO level of PTCBI is approximately −4.0 eV according to the result of cyclic voltammetry (CV).

Next, CzPA that is a substance having high hole-transport properties and molybdenum(VI) oxide that is an acceptor substance were co-evaporated on the electron-relay layer 2105 to form a second charge-generation layer 2106. The thickness of the second charge-generation layer 2106 was 60 mm. The weight ratio of CzPA to molybdenum(VI) oxide was adjusted to be 4:2 (=CzPA:molybdenum oxide).

Next, a second EL layer 2107 was formed on the second charge-generation layer 2106. A method for manufacturing the second EL layer 2107 is as follows: first, NPB was deposited to a thickness of 10 nm on the second charge-generation layer 2106 by an evaporation method using resistance heating.

After that, CzPA and 2PCAPA were co-evaporated to form a light-emitting layer 2107b with a thickness of 30 nm on the hole-transport layer 2107a. Here, the weight ratio of CzPA to 2PCAPA was adjusted to be 1:0.05 (=CzPA: 2PCAPA). Note that CzPA is a substance having electron-transport properties and 2PCAPA that is a guest material is a substance exhibiting green light emission.

Next, Alq with a thickness of 10 nm and then BPhen with a thickness of 20 nm were stacked on the light-emitting layer 2107b by evaporation to form an electron-transport layer 2107c. Then, lithium fluoride (LiF) was evaporated to a thickness of 1 nm on the electron-transport layer 2107c to form an electron-injection layer 2107d. Thus, the second EL layer 2107 including the hole-transport layer 2107a, the light-emitting layer 2107b, the electron-transport layer 2107c, and the electron-injection layer 2107d was formed.

Lastly, aluminum was deposited to a thickness of 200 nm on the electron-injection layer 2107d by an evaporation method using resistance heating to form a second electrode 2102. Thus, the light-emitting element 1 was manufactured.

Next, the comparative light-emitting element 1 will be described (see FIG. 8A). The comparative light-emitting element 1 of this example was manufactured in a manner similar to that of the light-emitting element 1 except for a first charge-generation layer 2103a of the first EL layer 2103 and a second charge-generation layer 2106. As for the comparative light-emitting element 1, 4,4'-bis[N-(1-naphthyl)-N-phenylamino]biphenyl (abbreviation: NPB) that is a substance having high hole-transport properties and molybdenum(VI) oxide that is an acceptor substance were co-evaporated to form the first charge-generation layer 2103a with a thickness of 50 nm on the first electrode 2101. In addition, in a manner similar to that of the first charge-generation layer 2103a, NPB and molybdenum(VI) oxide were co-evaporated to form the second charge-generation layer 2106 with a thickness of 60 nm on the electron-relay layer 2105. In each of the first charge-generation layer 2103a and the second charge generation layer 2106, the weight ratio of NPB to molybdenum(VI) oxide was adjusted to be 4:2 (=NPB:molybdenum(VI) oxide). Thus, the comparative light-emitting element 1 was obtained.

Next, the comparative light-emitting element 2 will be described (see FIG. 8B). The comparative light-emitting element 2 has the structure of the light-emitting element 1, from which the electron-relay layer 2105 is removed. The other layers were formed by manufacturing methods similar to those of the light-emitting element 1. In the comparative light-emitting element 2, after the electron-injection buffer 2104 was formed, the second charge-generation layer 2106 was formed on the electron-injection buffer 2104. Thus, the comparative light-emitting element 2 of this example was obtained.

Table 1 below shows the element structures of the light-emitting element 1, the comparative light-emitting element 1, and the comparative light-emitting element 2.

TABLE 1

|  | 2101 | 2103 | | | | 2104 |
|  |  | 2103a | 2103b | 2103c | 2103d |  |
| --- | --- | --- | --- | --- | --- | --- |
| LIGHT-EMITTING ELEMENT 1 | ITSO 110 nm | CzPA:MoOx (=4:2) 50 nm | NPB 10 nm | CzPA:2PCAPA (=1:0.05) 30 nm | Alq 10 nm / Bphen 20 nm | $Li_2O$ 0.1 nm |
| COMPARATIVE LIGHT-EMITTING ELEMENT 1 | ITSO 110 nm | NPB:MoOx (=4:2) 50 nm | NPB 10 nm | CzPA:2PCAPA (=1:0.05) 30 nm | Alq 10 nm / Bphen 20 nm | $Li_2O$ 0.1 nm |
| COMPARATIVE LIGHT-EMITTING ELEMENT 2 | ITSO 110 nm | CzPA:MoOx (=4:2) 50 nm | NPB 10 nm | CzPA:2PCAPA (=1:0.05) 30 nm | Alq 10 nm / Bphen 20 nm | $Li_2O$ 0.1 nm |

|  | 2105 | 2106 | 2107 | | | | 2102 |
|  |  |  | 2107a | 2107b | 2107c | 2107d |  |
| --- | --- | --- | --- | --- | --- | --- | --- |
| LIGHT-EMITTING ELEMENT 1 | PTCBI 3 nm | CzPA:MoOx (=4:2) 60 nm | NPB 10 nm | CzPA:2PCAPA (=1:0.05) 30 nm | Alq 10 nm / Bphen 20 nm | LiF 1 nm | Al 200 nm |

TABLE 1-continued

| | PTCBI | NPB:MoOx | NPB | CzPA:2PCAPA | Alq | Bphen | LiF | Al |
|---|---|---|---|---|---|---|---|---|
| COMPARATIVE LIGHT-EMITTING ELEMENT 1 | 3 nm | (=4:2) 60 nm | 10 nm | (=1:0.05) 30 nm | 10 nm | 20 nm | 1 nm | 200 nm |
| COMPARATIVE LIGHT-EMITTING ELEMENT 2 | — | CzPA:MoOx (=4:2) 60 nm | NPB 10 nm | CzPA:2PCAPA (=1:0.05) 30 nm | Alq 10 nm | Bphen 20 nm | LiF 1 nm | Al 200 nm |

The thus obtained light-emitting element 1, comparative light-emitting element 1, and comparative light-emitting element 2 were sealed in a glove box in a nitrogen atmosphere so that they were not exposed to the air. After that, the operation characteristics of those light-emitting elements were measured. Note that the measurement was carried out at room temperature (under an atmosphere in which the temperature was kept at 25° C.).

Figure 9:
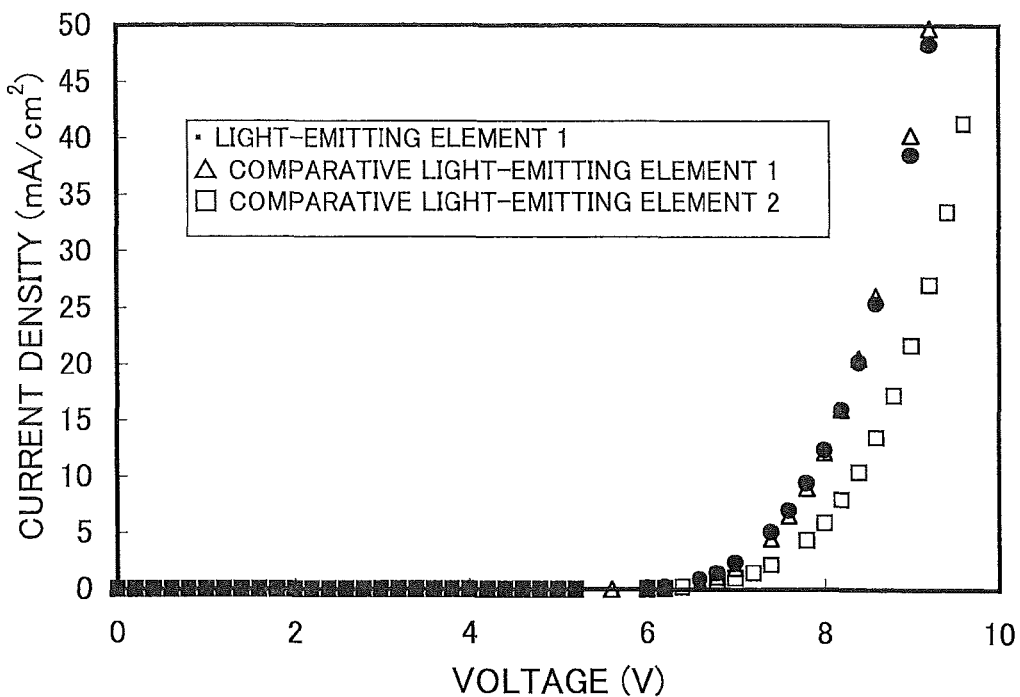
FIG. 9 is a graph showing characteristics of light-emitting elements of Example 1.
Figure 10:
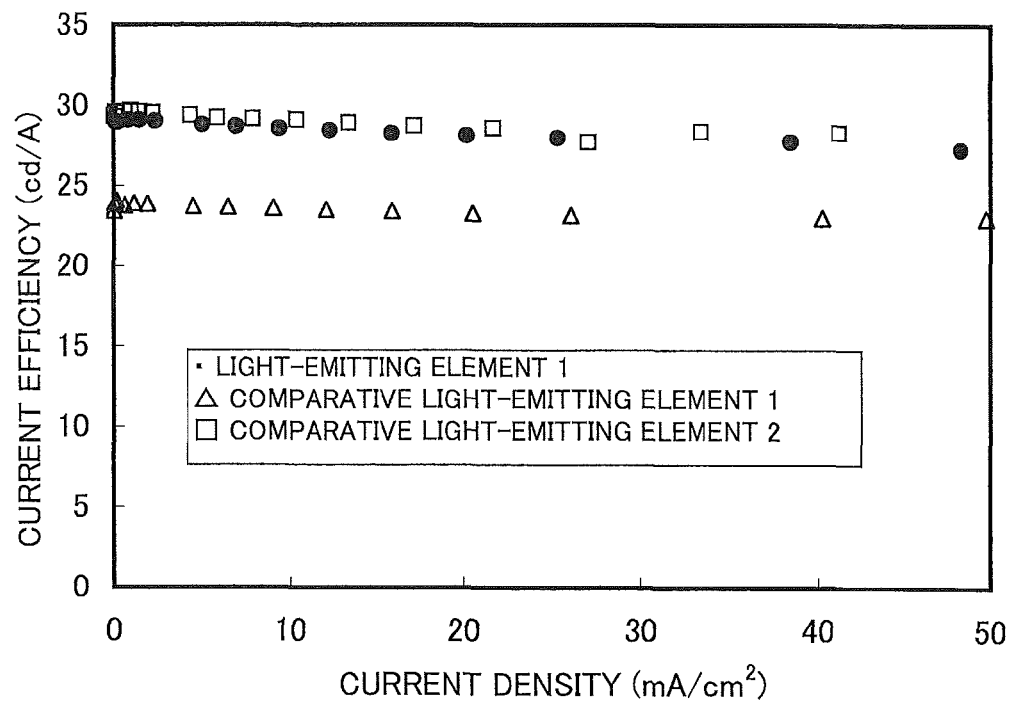
FIG. 10 is a graph showing characteristics of the light-emitting elements of Example 1.

FIG. 9 shows current density-voltage characteristics of the light-emitting element 1, the comparative light-emitting element 1, and the comparative light-emitting element 2. In FIG. 9, the horizontal axis represents applied voltage (V) and the vertical axis represents current density ($mA/cm^2$). FIG. 10 shows current efficiency-current density characteristics. In FIG. 10, the horizontal axis represents current density ($mA/cm^2$) and the vertical axis represents current efficiency (cd/A).

FIG. 9 shows that the light-emitting element 1 and the comparative light-emitting element 1, in each of which the electron-relay layer was provided, was driven at lower voltage than the comparative light-emitting element 2. Further, FIG. 10 shows that the light-emitting element 1 and the comparative light-emitting element 2, in each of which CzPA was contained in the charge-generation layer, could have higher current efficiency than the comparative light-emitting element 1.

Next, the results of measurement of light transmittance of the layer containing CzPA and molybdenum oxide and the layer containing NPB and molybdenum oxide, which are used in this example, will be described with reference to FIG. 11.

A glass substrate was fixed to a substrate holder provided in a vacuum evaporation apparatus, and then the pressure was reduced to about $10^{-4}$ Pa. After that, CzPA and molybdenum(VI) oxide were co-evaporated to form the layer containing CzPA and molybdenum oxide. The thickness of the layer was 50 nm. The weight ratio of CzPA to molybdenum(VI) oxide was adjusted to be 4:2 (=CzPA:molybdenum oxide).

In a manner similar to the above, a glass substrate was fixed to a substrate holder provided in a vacuum evaporation apparatus, and then the pressure was reduced to about $10^{-4}$ Pa. After that, NPB and molybdenum(VI) oxide were co-evaporated to form the layer containing NPB and molybdenum(VI) oxide. The thickness of the layer was 50 nm. The weight ratio of NPB to molybdenum(VI) oxide was adjusted to be 4:2 (=NPB:molybdenum oxide).

The light transmittance of the thus formed layer containing CzPA and molybdenum oxide and the layer containing NPB and molybdenum oxide was measured. FIG. 11 shows absorption spectrum of the layer containing CzPA and molybdenum oxide and absorption spectrum of the layer containing NPB and molybdenum oxide. As shown in FIG. 11, the peak of the absorption spectrum of the layer containing NPB and molybdenum oxide exists in a visible light region (a wavelength of around 500 nm). Meanwhile, it was found that the peak of the absorption spectrum based on charge transfer interaction of the layer containing CzPA and molybdenum oxide does not exist even in a visible light region and a near-infrared region. In addition, it was found that the peak of the absorption spectrum does not exist in the wavelength range of 420 nm to 720 nm.

Figure 11:
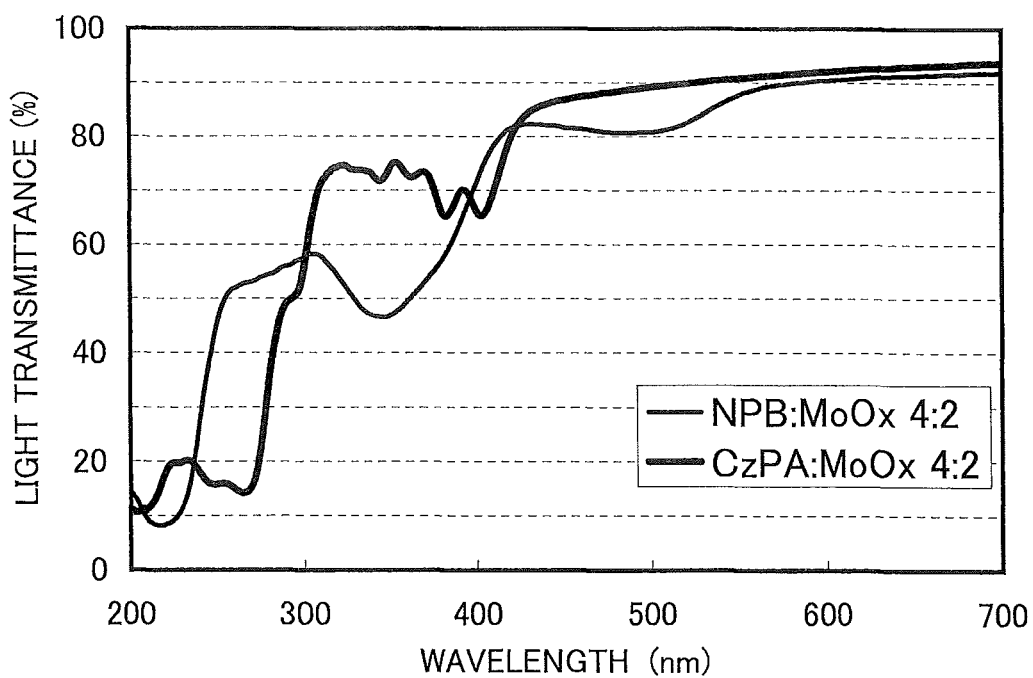
FIG. 11 is a graph showing light transmittance of the light-emitting elements of Example 1.

As shown in FIG. 11, the layer containing NPB that is an arylamine compound and molybdenum oxide has an absorption peak in the visible light region. Thus, in the case where this layer is used as the charge-generation layers of the light-emitting elements illustrated in FIGS. 8A and 8B, part of light emitted from the light-emitting layer is absorbed, which causes a decrease in luminous efficiency as in the comparative light-emitting element 2 shown in FIG. 10. However, as shown in FIG. 11, the layer containing CzPA that is a carbazole derivative not having an amine skeleton and molybdenum oxide does not have a peak of absorption based on charge transfer interaction even in the visible light region; thus, even if the layer is used as the charge-generation layers of the light-emitting elements illustrated in FIGS. 8A and 8B, light emitted from the light-emitting layer is hardly absorbed into the charge-generation layer. Thus, as shown in FIG. 10, the light-emitting element 1 and the comparative light-emitting element 1 can have higher luminous efficiency than the comparative light-emitting element 2.

The results shown in FIG. 10 and FIG. 11 show that the light-emitting element 1 in which the layer containing CzPA and molybdenum oxide is used as the charge-generation layer has higher luminous efficiency than the comparative light-emitting element 1 in which the layer containing NPB and molybdenum oxide is used as the charge-generation layer.

According to the above results, the light-emitting element 1 of this example was proved to be a light-emitting element which is capable of being driven at low voltage and has high luminous efficiency.

Example 2

In Example 2, a light-emitting element that is one embodiment of the present invention will be described with reference to FIG. 8A. Chemical formulae of materials used in this example are shown below.

[Chemical Formula 2]

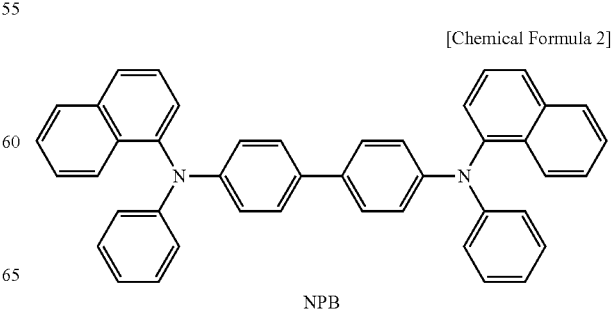

NPB

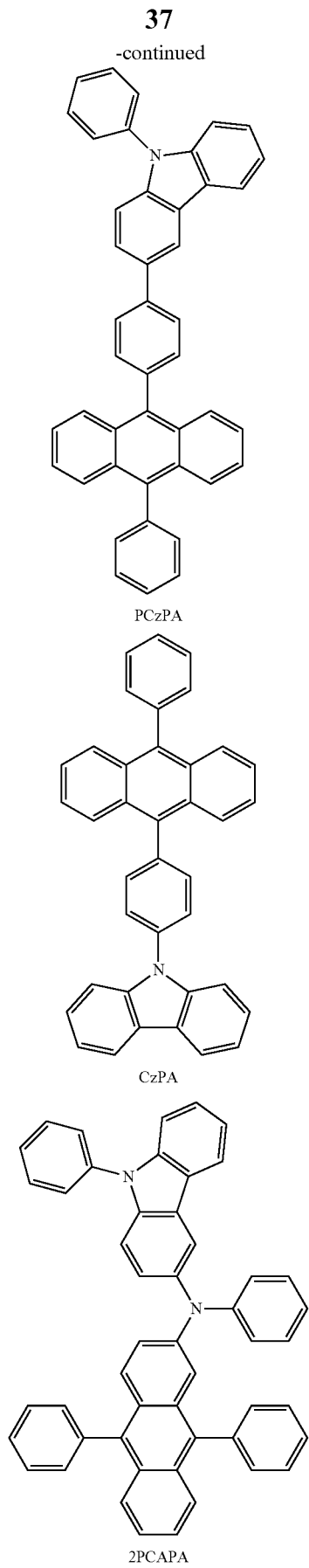

PCzPA

CzPA

2PCAPA

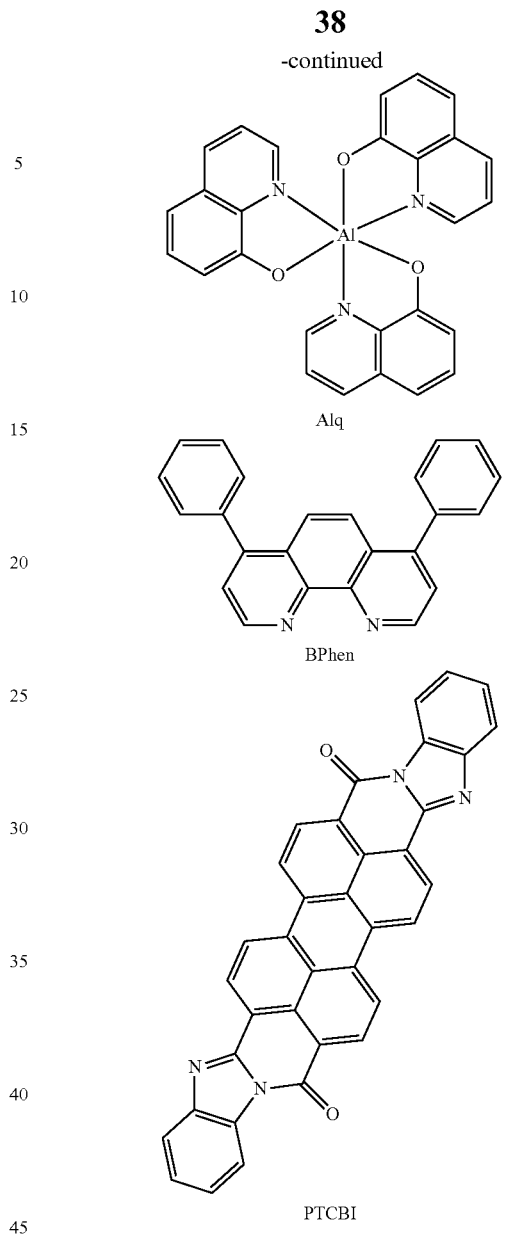

Alq

BPhen

PTCBI

Methods for manufacturing a light-emitting element 2 and a comparative light-emitting element 3 will be described below.

First, the light-emitting element 2 will be described (see FIG. 8A). Indium tin oxide containing silicon oxide was deposited over a glass substrate 2100 by a sputtering method to form a first electrode 2101. The first electrode 2101 had a thickness of 110 nm and an area of 2 mm×2 mm.

Next, the substrate on which the first electrode 2101 was formed was fixed to a substrate holder provided in a vacuum evaporation apparatus in such a way that a surface of the substrate on which the first electrode 2101 was formed faced downward, and then the pressure was reduced to about $10^{-4}$ Pa. After that, 9-phenyl-3-[4-(10-phenyl-9-anthryl)phenyl]-9H-carbazole (abbreviation: PCzPA) that is a substance having high hole-transport properties and molybdenum(VI) oxide that is an acceptor substance were co-evaporated on the first electrode 2101 to form a first charge-generation layer 2103a containing a composite material of an organic compound and an inorganic compound. The thickness of the first charge-generation layer 2103a was 50 nm. The weight ratio of PCzPA to molybdenum(VI) oxide was adjusted to be 4:2 (=PCzPA:molybdenum oxide).

Next, NPB was deposited to a thickness of 10 nm on the first charge-generation layer 2103a by an evaporation method using resistance heating to form a hole-transport layer 2103b.

Furthermore, 9-[4-(10-phenyl-9-anthryl)phenyl]-9H-carbazole (abbreviation: CzPA and N-(9,10-diphenyl-2-anthryl)-N,9-diphenyl-9H-carbazol-3-amine (abbreviation: 2PCAPA) were co-evaporated to form a light-emitting layer 2103c with a thickness of 30 nm on the hole-transport layer 2103b. Here, the weight ratio of CzPA to 2PCAPA was adjusted to be 1:0.05 (=CzPA:2PCAPA). Note that CzPA is a substance having electron-transport properties and 2PCAPA that is a guest material is a substance exhibiting green light emission.

After that, by an evaporation method using resistance heating, Alq was evaporated to a thickness of 10 nm on the light-emitting layer 2103c, and then BPhen was evaporated to a thickness of 10 nm to be stacked thereon, whereby an electron-transport layer 2103d was formed. Thus, a first EL layer 2103 including the first charge-generation layer 2103a, the hole-transport layer 2103b, the light-emitting layer 2103c, and the electron-transport layer 2103d was formed.

Next, lithium oxide (Li$_2$O) was evaporated to a thickness of 0.1 nm on the electron-transport layer 2103d to form an electron-injection buffer 2104.

Next, 3,4,9,10-perylenetetracarboxylic-bis-benzimidazole (abbreviation: PTCBI) was evaporated to form an electron-relay layer 2105 with a thickness of 3 nm on the electron-injection buffer 2104. Note that the LUMO level of PTCBI is approximately −4.0 eV according to the result of cyclic voltammetry (CV).

Next, PCzPA that is a substance having high hole-transport properties and molybdenum(VI) oxide that is an acceptor substance were co-evaporated on the electron-relay layer 2105 to form a second charge-generation layer 2106. The thickness of the second charge-generation layer 2106 was 60 nm. The weight ratio of PCzPA to molybdenum(VI) oxide was adjusted to be 4:2 (=PCzPA:molybdenum oxide).

Next, a second EL layer 2107 was formed on the second charge-generation layer 2106. A method for manufacturing the second EL layer 2107 is as follows: first, NPB was deposited to a thickness of 10 nm on the second charge-generation layer 2106 by an evaporation method using resistance heating.

After that, CzPA and 2PCAPA were co-evaporated to form a light-emitting layer 2107b with a thickness of 30 nm on the hole-transport layer 2107a. Here, the weight ratio of CzPA to 2PCAPA was adjusted to be 1:0.05 (=CzPA:2PCAPA). Note that CzPA is a substance having electron-transport properties and 2PCAPA that is a guest material is a substance exhibiting green light emission.

Next, Alq with a thickness of 10 nm and then BPhen with a thickness of 20 nm were stacked on the light-emitting layer 2107b by evaporation to form an electron-transport layer 2107c. Then, lithium fluoride (LiF) was evaporated to a thickness of 1 nm on the electron-transport layer 2107c to form an electron-injection layer 2107d. Thus, the second EL layer 2107 including the hole-transport layer 2107a, the light-emitting layer 2107b, the electron-transport layer 2107c, and the electron-injection layer 2107d was formed.

Lastly, aluminum was deposited to a thickness of 200 nm on the electron-injection layer 2107d by an evaporation method using resistance heating to form a second electrode 2102. Thus, the light-emitting element 2 was manufactured.

Next, the comparative light-emitting element 3 will be described (see FIG. 8A). The comparative light-emitting element 3 of this example was manufactured in a manner similar to that of the light-emitting element 2 described in this example except for a first charge-generation layer 2103a of the first EL layer 2103 and a second charge-generation layer 2106. As for the comparative light-emitting element 3, 4,4'-bis[N-(1-naphthyl)-N-phenylamino]biphenyl (abbreviation: NPB) that is a substance having high hole-transport properties and molybdenum(VI) oxide that is an acceptor substance were co-evaporated to form the first charge-generation layer 2103a with a thickness of 50 nm on the first electrode 2101. In addition, in a manner similar to that of the first charge-generation layer 2103a, NPB and molybdenum (VI) oxide were co-evaporated to form the first charge-generation layer 2106 with a thickness of 60 nm on the electron-relay layer 2105. In each of the first charge-generation layer 2103a and the second charge generation layer 2106, the weight ratio of NPB to molybdenum(VI) oxide was adjusted to be 4:2 (=NPB:molybdenum(VI) oxide). Thus, the comparative light-emitting element 1 was obtained.

Table 2 below shows the element structures of the light-emitting element 2 and the comparative light-emitting element 3.

TABLE 2

| | | 2103 | | | | |
|---|---|---|---|---|---|---|
| | 2101 | 2103a | 2103b | 2103c | 2103d | 2104 |
| COMPARATIVE LIGHT-EMITTING ELEMENT 2 | ITSO 110 nm | PCzPA:MoOx (=4:2) 50 nm | NPB 10 nm | CzPA:2PCAPA (=1:0.05) 30 nm | Alq 10 nm / Bphen 10 nm | Li$_2$O 0.1 nm |
| COMPARATIVE LIGHT-EMITTING ELEMENT 3 | ITSO 110 nm | NPB:MoOx (=4:2) 50 nm | NPB 10 nm | CzPA:2PCAPA (=1:0.05) 30 nm | Alq 10 nm / Bphen 10 nm | Li$_2$O 0.1 nm |

| | | 2107 | | | | |
|---|---|---|---|---|---|---|
| 2105 | 2106 | 2107a | 2107b | 2107c | 2107d | 2102 |
| PTCBI 3 nm | PCzPA:MoOx (=4:2) 60 nm | NPB 10 nm | CzPA:2PCAPA (=1:0.05) 30 nm | Alq 10 nm / Bphen 20 nm | LiF 1 nm | Al 200 nm |

(COMPARATIVE LIGHT-EMITTING ELEMENT 2)

TABLE 2-continued

| COMPARATIVE LIGHT-EMITTING ELEMENT 3 | PTCBI 3 nm | NPB:MoOx (=4:2) 60 nm | NPB 10 nm | CzPA:2PCAPA (=1:0.05) 30 nm | Alq 10 nm | Bphen 20 nm | LiF 1 nm | Al 200 nm |
|---|---|---|---|---|---|---|---|---|

The thus obtained light-emitting element 2 and comparative light-emitting element 3 were sealed in a glove box in a nitrogen atmosphere so that they were not exposed to the air. After that, the operating characteristics of those light-emitting elements were measured. Note that the measurement was carried out at room temperature (under an atmosphere in which the temperature was kept at 25° C.).

Figure 13:
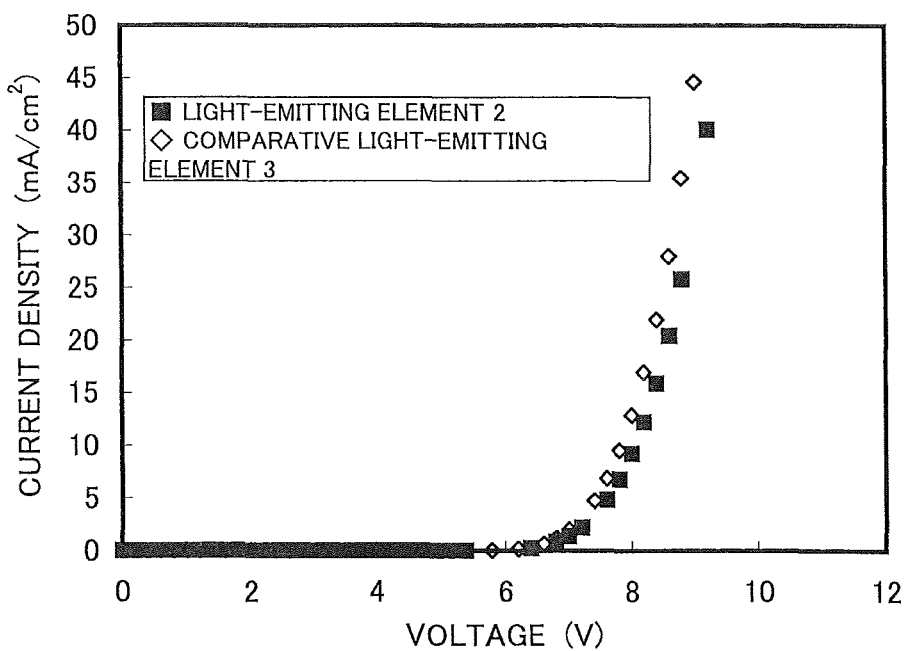
FIG. 13 is a graph showing characteristics of light-emitting elements of Example 2.
Figure 14:
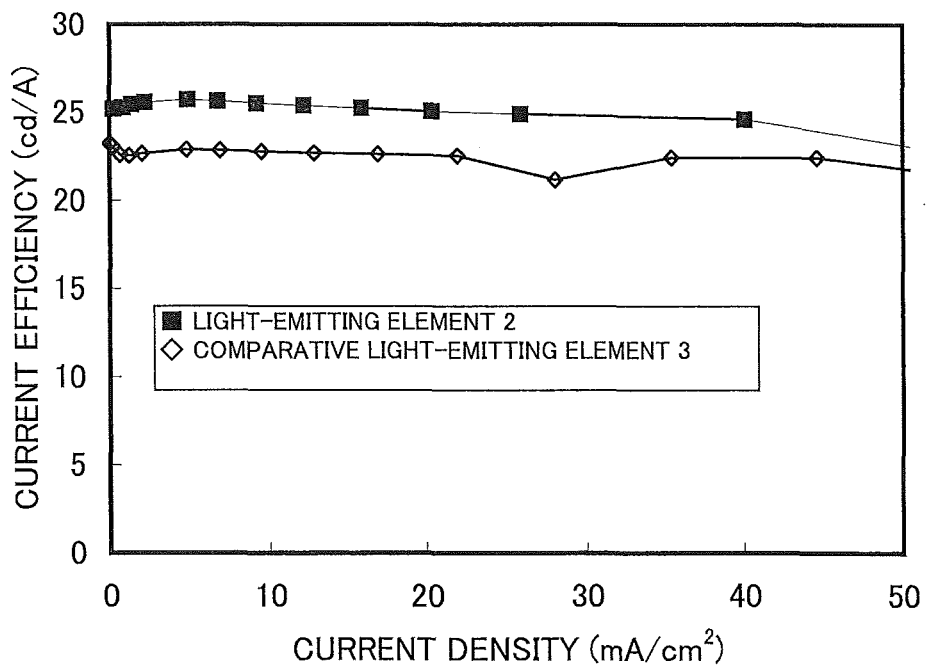
FIG. 14 is a graph showing characteristics of the light-emitting elements of Example 2.

FIG. 13 shows current density-voltage characteristics of the light-emitting element 2 and the comparative light-emitting element 3. In FIG. 13, the horizontal axis represents applied voltage (V) and the vertical axis represents current density (mA/cm$^2$). FIG. 14 shows current efficiency-current density characteristics. In FIG. 14, the horizontal axis represents current density (mA/cm$^2$) and the vertical axis represents current efficiency (cd/A).

FIG. 13 shows that the light-emitting element 2 in which PCzPA is contained in the charge-generation layer is driven at lower voltage than the comparative light-emitting element 3. Further, FIG. 14 shows that the light-emitting element 2 in which PCzPA is contained in the charge-generation layer can have higher current efficiency than the comparative light-emitting element 3.

Next, the results of measurement of light transmittance of the layer containing PCzPA and molybdenum oxide, which are used in this example, will be described with reference to FIG. 15.

A glass substrate was fixed to a substrate holder provided in a vacuum evaporation apparatus, and then the pressure was reduced to about 10$^{-4}$ Pa. After that, PCzPA and molybdenum(VI) oxide were co-evaporated to form the layer containing PCzPA and molybdenum oxide. The thickness of the layer was 50 nm. The weight ratio of PCzPA to molybdenum(VI) oxide was adjusted to be 4:2 (=PCzPA: molybdenum oxide).

The light transmittance of the thus formed layer containing PCzPA and molybdenum oxide was measured. FIG. 15 shows absorption spectrum of the layer containing PCzPA and molybdenum oxide. As shown in FIG. 15, the peak of the absorption spectrum based on charge transfer interaction of the layer containing PCzPA and molybdenum oxide does not exist even in a visible light region and a near-infrared region. In addition, the peak of the absorption spectrum does not exist in the wavelength range of 420 nm to 720 nm. Note that the ionization potential of PCzPA is 5.7 eV (AC-2, product of Riken Keiki Co., Ltd.), which is relatively high.

Figure 15:
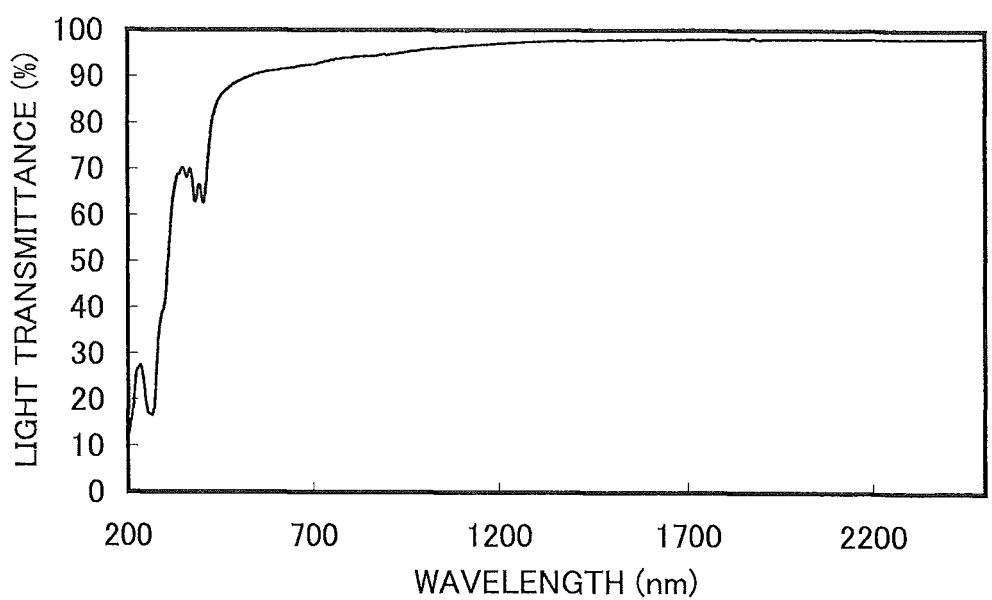
FIG. 15 is a graph showing light transmittance of the light-emitting element of Example 2.

As shown in FIG. 15, the layer containing PCzPA that is a carbazole derivative not having an amine skeleton and molybdenum oxide does not have a peak of absorption based on charge transfer interaction even in the visible light region and the near-infrared region; thus, even if the layer is used as the charge-generation layer of the light-emitting element 2, light emitted from the light-emitting layer is hardly absorbed into the charge-generation layer. Thus, the second light-emitting element 2 can have improved luminous efficiency.

The results shown in FIGS. 13 to 15 show that the light-emitting element 2 in which the layer containing PCzPA and molybdenum oxide is used as the charge-generation layer has high luminous efficiency.

According to the above results, the light-emitting element 2 of this example was proved to be a light-emitting element which is capable of being driven at low voltage and has high luminous efficiency.

Example 3

In Example 3, a light-emitting element that is one embodiment of the present invention will be described with reference to FIG. 8A. Chemical formulae of materials used in this example are shown below.

[Chemical Formula 3]

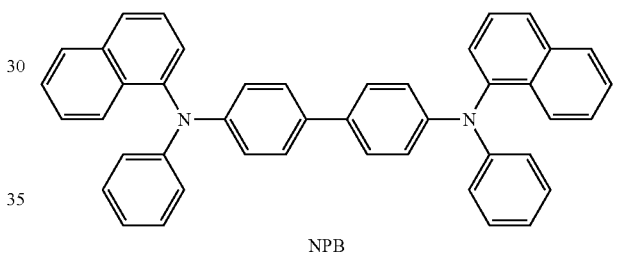

NPB

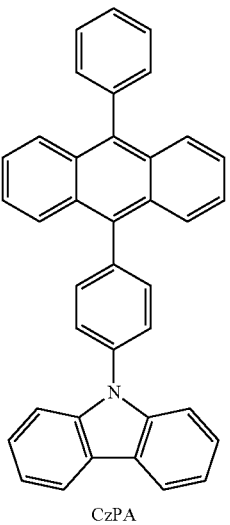

CzPA

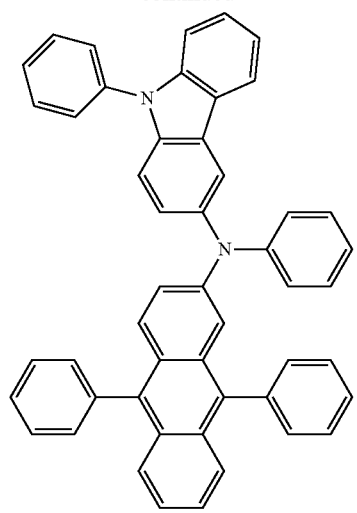
2PCAPA
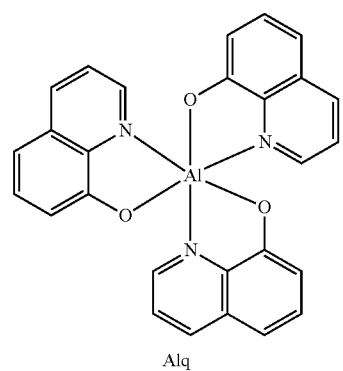
Alq
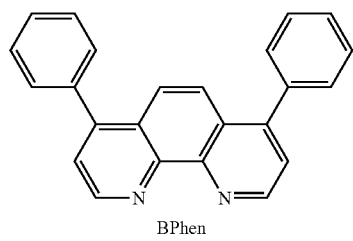
BPhen
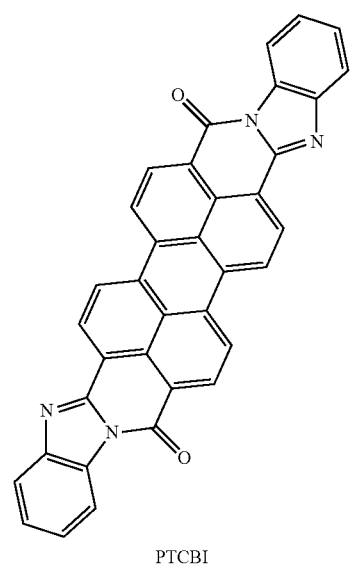
PTCBI
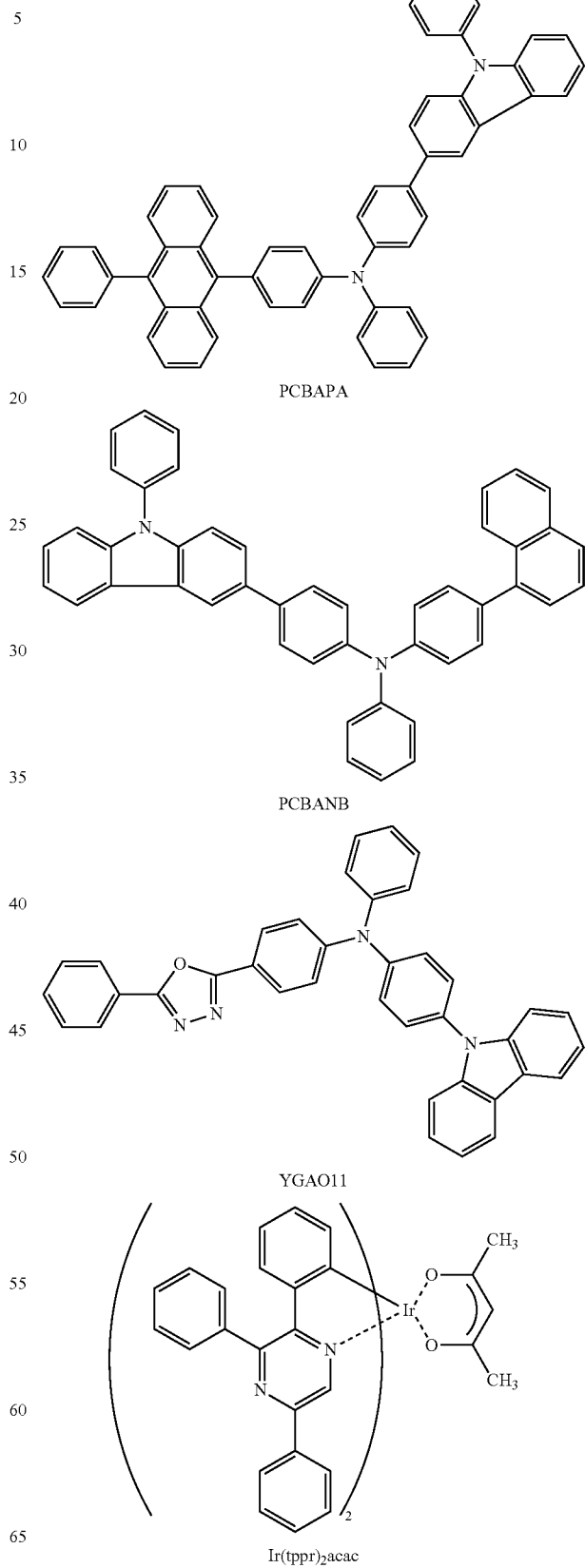
PCBAPA
PCBANB
YGAO11
Ir(tppr)₂acac

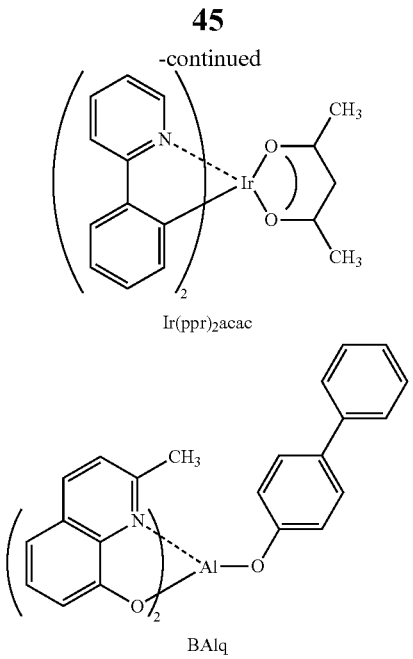

Ir(ppr)₂acac

BAlq

A method for manufacturing a light-emitting element 3 will be described below.

The light-emitting element 3 will be described (see FIG. 8A). Indium tin oxide containing silicon oxide was deposited over a glass substrate 2100 by a sputtering method to form a first electrode 2101. The first electrode 2101 had a thickness of 110 nm and an area of 2 mm×2 mm.

Next, the substrate on which the first electrode 2101 was formed was fixed to a substrate holder provided in a vacuum evaporation apparatus in such a way that a surface of the substrate on which the first electrode 2101 was formed faced downward, and then the pressure was reduced to about $10^{-4}$ Pa. After that, 9-[4-(10-phenyl-9-anthryl)phenyl]-9H-carbazole (abbreviation: CzPA) that is a substance having high hole-transport properties and molybdenum(VI) oxide that is an acceptor substance were co-evaporated on the first electrode 2101 to form a first charge-generation layer 2103a containing a composite material of an organic compound and an inorganic compound. The thickness of the first charge-generation layer 2103a was 50 nm. The weight ratio of CzPA to molybdenum(VI) oxide was adjusted to be 4:2 (=CzPA:molybdenum oxide).

Next, NPB was deposited to a thickness of 10 nm on the first charge-generation layer 2103a by an evaporation method using resistance heating to form a hole-transport layer 2103b.

Furthermore, 4-(10-phenyl-9-anthryl)-4'-(9-phenyl-9H-carbazol-3-yl)triphenylamine (abbreviation: PCBAPA) and 4-(1-naphthyl)-4'(9-phenyl-9H-carbazol-3-yl)-triphenylamine (abbreviation: PCBANB) were co-evaporated to a thickness of 20 nm, and then CzPA and SD1 (product name; manufactured by SFC Co., Ltd) were co-evaporated thereon to a thickness of 10 nm, whereby a light-emitting layer 2103c was formed. Note that the weight ratio of PCBAPA to PCBANB was adjusted to be 1:1 (=PCBAPA:PCBANB). Note also that the weight ratio of CzPA to SD1 was adjusted to be 1:0.05 CzPA:SD1).

After that, by an evaporation method using resistance heating, BPhen was evaporated to a thickness of 30 nm to be stacked on the light-emitting layer 2103c, whereby an electron-transport layer 2103d was formed. Thus, a first EL layer 2103 including the first charge-generation layer 2103a, the hole-transport layer 2103b, the light-emitting layer 2103c, and the electron-transport layer 2103d was formed.

Next, lithium oxide ($Li_2O$) was evaporated to a thickness of 0.1 nm on the electron-transport layer 2103d to form an electron-injection buffer 2104.

Next, 3,4,9,10-perylenetetracarboxylic-bis-benzimidazole (abbreviation: PTCBI) was evaporated to form an electron-relay layer 2105 with a thickness of 3 nm on the electron-injection buffer 2104. Note that the LUMO level of PTCBI is approximately −4.0 eV according to the result of cyclic voltammetry (CV).

Next, CzPA that is a substance having high hole-transport properties and molybdenum(VI) oxide that is an acceptor substance were co-evaporated on the electron-relay layer 2105 to form a second charge-generation layer 2106. The thickness of the second charge-generation layer 2106 was 60 mm. The weight ratio of CzPA to molybdenum(VI) oxide was adjusted to be 4:2 (=CzPA:molybdenum oxide).

Next, a second EL layer 2107 was formed on the second charge-generation layer 2106. A method for manufacturing the second EL layer 2107 is as follows: first, NPB was deposited to a thickness of 10 nm on the second charge-generation layer 2106 to form a hole-transport layer 2107a by an evaporation method using resistance heating.

After that, 2-(4-{N-[4-(carbazol-9-yl)phenyl]-N-phenylamino}phenyl)-5-phenyl-1,3,4-oxadiazole (abbreviation: YGAO11) and (acetylacetonato)bis(2,3,5-triphenylpyrazinato)iridium(III) (abbreviation: Ir(tppr)₂(acac)) were co-evaporated to a thickness of 10 nm, and then YGAO11 and bis(2-phenylpyridinato-N,$C^{2'}$)iridium(III) acetylacetonate (abbreviation: Ir(ppy)₂acac) were co-evaporated to a thickness of 20 nm, whereby a light-emitting layer 2107b was formed over the hole-transport layer 2107a. Note that the weight ratio of YGAO11 to Ir(tppr)₂(acac) was adjusted to be 1:0.06 (=YGAO11:Ir(tppr)₂(acac)). Note also that that the weight ratio of YGAO11 to Ir(ppy)₂acac was adjusted to be 1:0.06 (=YGAO11:Ir(ppy)₂acac).

Next, BAlq with a thickness of 10 nm and then BPhen with a thickness of 20 nm were stacked on the light-emitting layer 2107b by evaporation to form an electron-transport layer 2107c. Then, lithium fluoride (LiF) was evaporated to a thickness of 1 nm on the electron-transport layer 2107c to form an electron-injection layer 2107d. Thus, the second EL layer 2107 including the hole-transport layer 2107a, the light-emitting layer 2107b, the electron-transport layer 2107c, and the electron-injection layer 2107d was formed.

Lastly, aluminum was deposited to a thickness of 200 nm on the electron-injection layer 2107d by an evaporation method using resistance heating to form a second electrode 2102. Thus, the light-emitting element 3 was manufactured.

Table 3 below shows the element structure of the light-emitting element 3.

TABLE 3

| | | | 2103 | | | | |
|---|---|---|---|---|---|---|---|
| | 2101 | 2103a | 2103b | 2103c | 2103d | 2104 | 2105 |
| LIGHT-EMITTING ELEMENT 3 | ITSO 110 nm | CzPA:MoOx (=4:2) 50 nm | NPB 10 nm | PCBAPA:PCBANB (=1:1) 20 nm | CzPA:SD1 (=1:0.05) 10 nm | Bphen 30 nm | Li$_2$O 0.1 nm | PTCBI 3 nm |

| | | 2107 | | | | |
|---|---|---|---|---|---|---|
| | 2106 | 2107a | 2107b | | 2107c | 2107d | 2102 |
| LIGHT-EMITTING ELEMENT 3 | CzPA:MoOx (=4:2) 60 nm | NPB 10 nm | YGAO11:Ir(tppr)2acac (=1:0.06) 10 nm | YGAO11:Ir(ppy)wacac (=1:0.06) 20 nm | BAlq 10 nm | Bphen 20 nm | LiF 1 nm | Al 200 nm |

The thus obtained light-emitting element 3 was sealed in a glove box in a nitrogen atmosphere so that they were not exposed to the air. After that, the operating characteristics of those light-emitting elements were measured. Note that the measurement was carried out at room temperature (under an atmosphere in which the temperature was kept at 25° C.).

Figure 16:
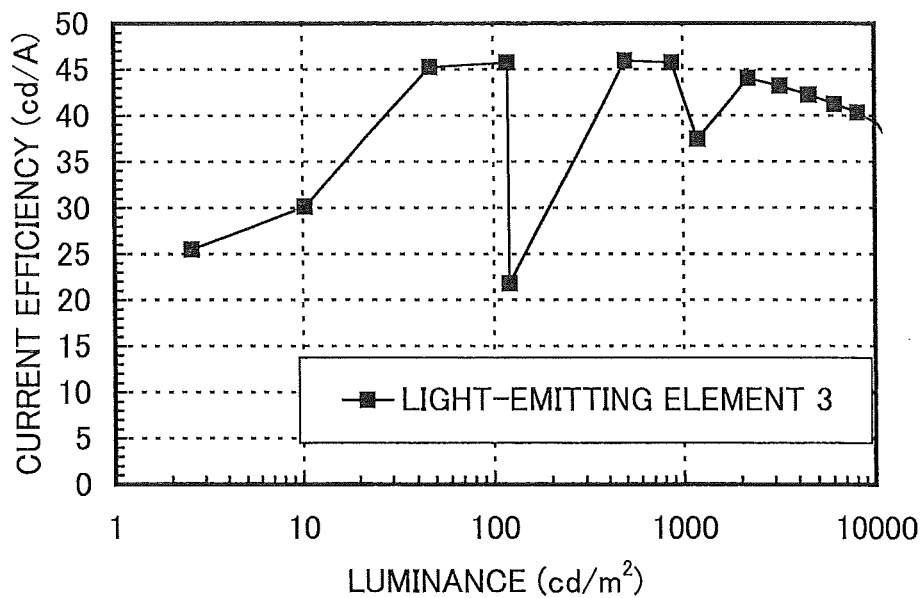
FIG. 16 is a graph showing characteristics of a light-emitting element of Example 3.
Figure 17:
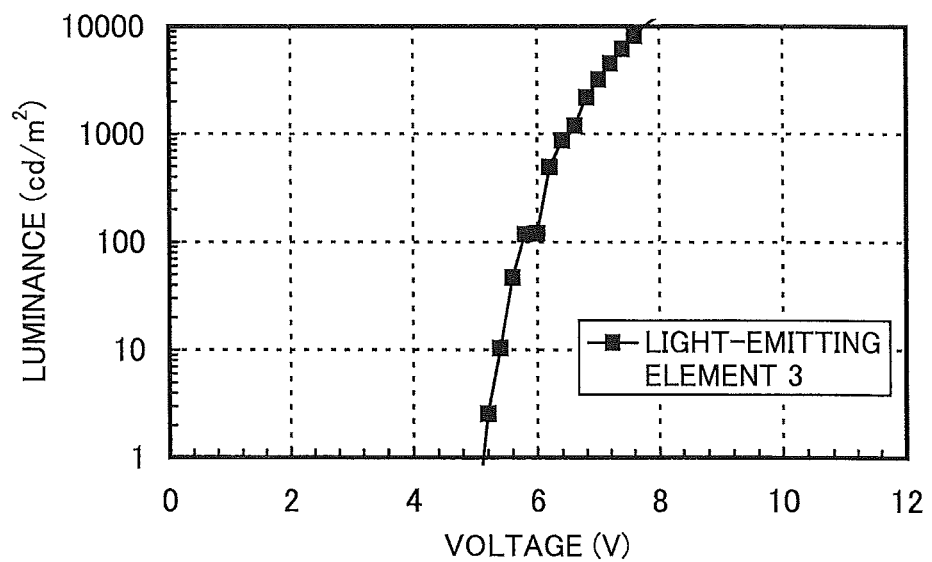
FIG. 17 is a graph showing characteristics of the light-emitting element of Example 3.
Figure 18:
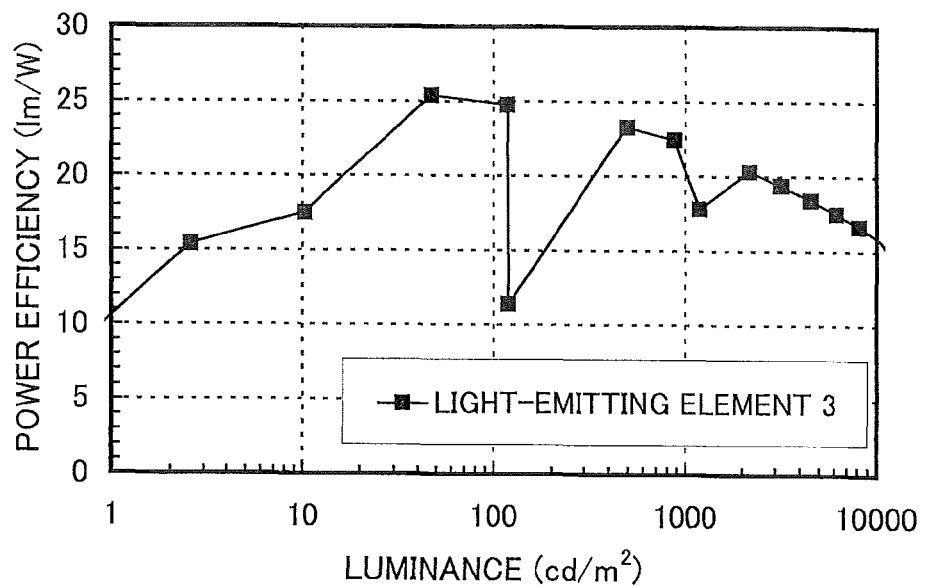
FIG. 18 is a graph showing characteristics of the light-emitting element of Example 3.
Figure 19:
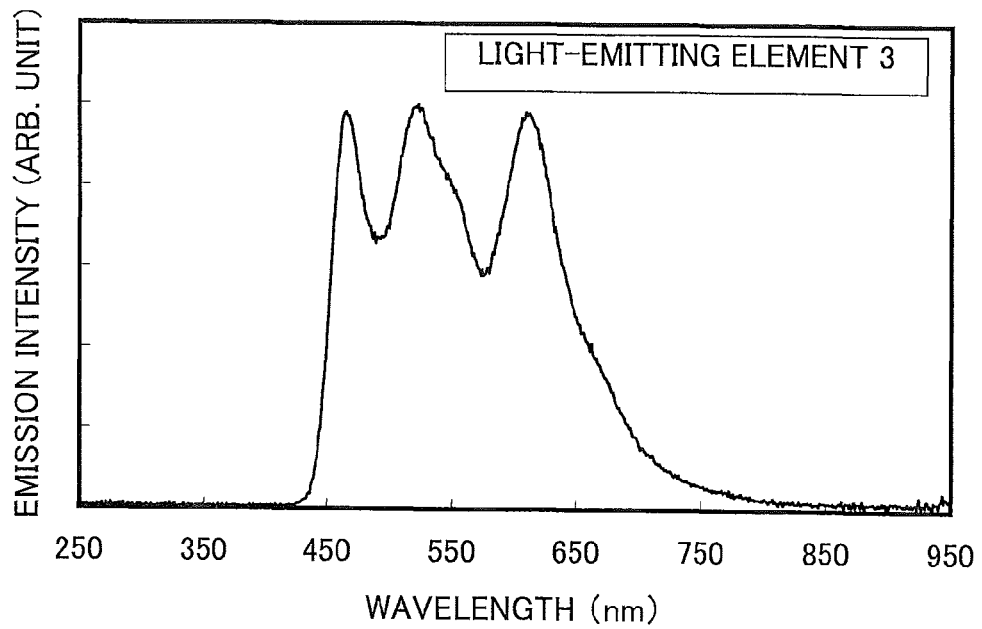
FIG. 19 is a graph showing characteristics of the light-emitting element of Example 3.

FIG. 16 shows luminance-current efficiency characteristics of the light-emitting element 3. In FIG. 16, the horizontal axis represents luminance (cd/m$^2$) and the vertical axis represents current efficiency (cd/A). FIG. 17 shows voltage-luminance characteristics. In FIG. 17, the horizontal axis represents voltage (V) and the vertical axis represents luminance (cd/m$^2$). FIG. 18 shows luminance-power efficiency characteristics. In FIG. 18, the horizontal axis represents luminance (cd/cm$^2$) and the vertical axis represents power efficiency (1 m/W). FIG. 19 shows an emission spectrum when a current of 0.1 mA flows through the light-emitting element 3.

Further, the CIE chromaticity coordinates of the light emitting element 3 at a luminance of 950 cd/m$^2$ was (x=0.34, y=0.39), and light emission was white. The external quantum efficiency at a luminance of 950 cd/m$^2$ was as high as 21.1%. The general color rendering index (Ra) was 91, which means good color rending properties.

According to the above results, the light-emitting element 3 of this example was proved to be a light-emitting element which is capable of being driven at low voltage and has high luminous efficiency.

Reference Example

In this reference example, a synthesis method of the material used in the above example will be specifically described.

Synthesis Example of 4-(1-naphthyl)-4'-(9-phenyl-9H-carbazol-3-yl)-triphenylamine (Abbreviation: PCBANB)

Synthesis scheme of 4-(1-naphthyl)-4'-(9-phenyl-9H-carbazol-3-yl)-triphenylamine is shown below (A-1).

[Chemical Formula 5]

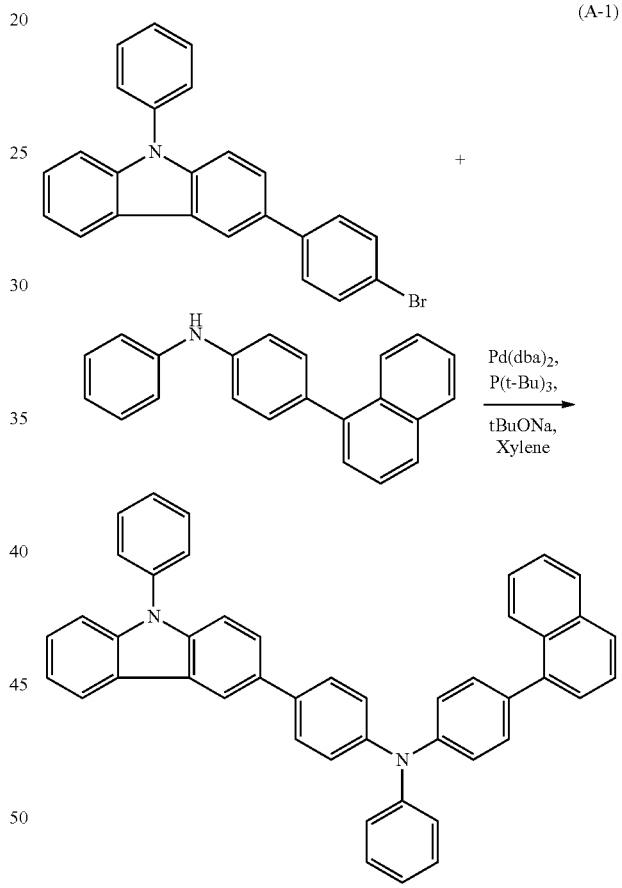

(A-1)

In a 50-mL three-neck flask were put 1.2 g (3.0 mmol) of 3-(4-bromophenyl)-9-phenyl-9H-carbazole, 0.9 g (3.0 mmol) of 4-(1-naphthyl)diphenylamine, 0.5 g (5.0 mmol) of sodium tert-butoxide, and 6.0 mg (0.01 mmol) of bis(dibenzylideneacetone)palladium(0). Then, 15 mL of dehydrated xylene was added to this mixture. The mixture was deaerated while being stirred under reduced pressure, and after the deaeration, 0.06 mL (0.03 mmol) of tri(tert-butyl)phosphine (10 wt % hexane solution) was added thereto. This mixture was stirred in a nitrogen atmosphere at 120° C. for 4.5 hours to be reacted.

After the reaction, 250 mL of toluene was added to this reaction mixture, and this suspension was filtrated through Florisil, silica gel, alumina, and then Celite. The obtained filtrate was washed with water and magnesium sulfate was added to remove moisture. This suspension was filtrated through Florisil, alumina, silica gel, and then Celite to obtain a filtrate. The obtained filtrate was concentrated, and acetone and methanol were added thereto. The mixture was exposed to ultrasonic waves and recrystallized to obtain 1.5 g of objective white powder at a yield of 82%.

An Rf value of the objective substance by a silica gel thin layer chromatography (TLC) (developing solvent; ethyl acetate:hexane=1:10) was 0.34, that of 3-(4-bromophenyl)-9-phenyl-9H-carbazole was 0.46, and that of 4-(1-naphthyl)diphenylamine was 0.25.

A compound that was obtained through the above step was measured by a nuclear magnetic resonance method ($^1$H NMR). The measurement data are shown below. The measurement results show that PCBANB (abbreviation) that was an objective substance was obtained.

$^1$H NMR (CDCl$_3$, 300 MHz): δ (ppm)=7.07 (t, J=6.6 Hz, 1H), 7.25-7.67 (m, 26H), 7.84 (d, J=7.8 Hz, 1H), 7.89-7.92 (m, 1H), 8.03-8.07 (m, 1H), 8.18 (d, J=7.8 Hz, 1H), 8.35 (d, J=0.9 Hz, 1H).

This application is based on Japanese Patent Application serial no. 2009-206431 filed with Japan Patent Office on Sep. 7, 2009, the entire contents of which are hereby incorporated by reference.

EXPLANATION OF REFERENCE

10: substrate, 11: transistor, 12: light-emitting element, 13: electrode, 14: electrode, 15: layer, 16: first interlayer insulating film, 16a: first interlayer insulating film, 16b: first interlayer insulating film, 16c: first interlayer insulating film, 17: wiring, 18: partition layer, 19: second interlayer insulating film, 19a: second interlayer insulating film, 19b: second interlayer insulating film, 101: anode, 102: cathode, 103: EL layer, 103a: first light-emitting layer, 103b: second light-emitting layer, 104: electron injection buffer, 105: electron-relay layer, 106: charge-generation layer, 107: EL layer, 107a: third light-emitting layer, 107b: fourth light-emitting layer, 108: electron-transport layer, 111: Fermi level of anode, 112: Fermi level of cathode, 113: LUMO level of first EL layer, 114: LUMO level of electron-relay layer, 115: acceptor level of acceptor in charge-generation layer, 116: LUMO level of second EL layer, 330: first light emission, 340: second light emission, 951: substrate, 952: electrode, 953; insulating layer, 954: partition layer, 955: layer containing organic compound, 956: electrode, 2100: glass substrate, 2101: electrode, 2102: electrode, 2103: EL layer, 2103a: charge-generation layer, 2103b: hole-transport layer, 2103c: light-emitting layer, 2103d: electron-transport layer, 2104: electron-injection buffer, 2105: electron-relay layer, 2106: charge-generation layer, 2107: EL layer, 2107a: hole-transport layer, 2107b: light-emitting layer, 2107c: electron-transport layer, 2107d: electron-injection layer, 2108: EL layer, 2108a: light-emitting layer, 2108b: electron-transport layer, 2108c: electron-injection layer, 3000: light source, 3001: lighting device, 3002: lighting device, 9100: mobile phone, 9101: housing, 9102: housing, 9103: joining portion, 9104: display portion, 9106: operation key, 9106: portable information terminal device, 9201: housing, 9202: display portion, 9203: housing, 9205: keyboard, 9207: joining portion, 9400: computer, 9401: housing, 9402: display portion, 9403: keyboard, 9404: housing, 9500: digital video camera, 9501: housing, 9503: display portion, 9600: television set, 9601: housing, 9603: display portion, 9605: stand, 9607: display portion, 9609: operation key, 9610: remote controller, and 9703: display portion.

What is claimed is:

1. A light-emitting element comprising:
n EL layers (n is a natural number of two or more) between an anode and a cathode, each of the n EL layers comprising at least a light-emitting layer;
a first layer between an m-th EL layer (m is a natural number, 1≤m≤n−1) and an (m+1)-th EL layer, the first layer comprising at least one of an alkali metal, an alkaline earth metal, and a rare earth metal;
a second layer between the first layer and the (m+1)-th EL layer, the second layer comprising an electron-transporting material; and
a charge-generation layer between the second layer and the (m+1)-th EL layer, the charge-generation layer comprising a hole-transporting material and an acceptor substance,
wherein each of the n EL layers further comprises a hole-transporting layer and an electron-transporting layer with the light-emitting layer interposed therebetween, and
wherein the charge-generation layer does not have a peak of an absorption spectrum in a visible light region.

2. The light-emitting element according to claim 1, wherein the electron-transporting material has a LUMO level of greater than or equal to −5.0 eV.

3. The light-emitting element according to claim 1, wherein the electron-transporting material is a perylene derivative or a nitrogen-containing condensed aromatic compound.

4. The light-emitting element according to claim 1, wherein the acceptor substance is a transition metal oxide or an oxide of a metal belonging to any of Groups 4 to 8 of the periodic table.

5. The light-emitting element according to claim 1, wherein the hole-transporting material is a carbazole derivative or aromatic hydrocarbon.

6. The light-emitting element according to claim 1, wherein the acceptor substance is molybdenum oxide.

7. A light-emitting device comprising the light-emitting element according to claim 1.

8. A light-emitting element comprising:
n EL layers (n is a natural number of two or more) between an anode and a cathode, each of the n EL layers comprising at least a light-emitting layer;
a first layer between an m-th EL layer (m is a natural number, 1≤m≤n−1) and an (m+1)-th EL layer, the first layer comprising a first electron-transporting material and a donor substance;
a second layer between the first layer and the (m+1)-th EL layer, the second layer comprising a second electron-transporting material; and
a charge-generation layer between the second layer and the (m+1)-th EL layer, the charge-generation layer comprising a hole-transporting material and an acceptor substance,
wherein each of the n EL layers further comprises a hole-transporting layer and an electron-transporting layer with the light-emitting layer interposed therebetween, and
wherein the charge-generation layer does not have a peak of an absorption spectrum in a visible light region.

9. The light-emitting element according to claim 8, wherein the donor substance comprises at least one of an alkali metal, an alkaline earth metal, and a rare earth metal.

10. The light-emitting element according to claim 8, wherein each of the first electron-transporting material and the second electron-transporting material has a LUMO level of greater than or equal to −5.0 eV.

11. The light-emitting element according to claim 8, wherein each of the first electron-transporting material and the second electron-transporting material is a perylene derivative or a nitrogen-containing condensed aromatic compound.

12. The light-emitting element according to claim 8, wherein the acceptor substance is a transition metal oxide or an oxide of a metal belonging to any of Groups 4 to 8 of the periodic table.

13. The light-emitting element according to claim 8, wherein the hole-transporting material is a carbazole derivative or aromatic hydrocarbon.

14. The light-emitting element according to claim 8, wherein the acceptor substance is molybdenum oxide.

15. A light-emitting device comprising the light-emitting element according to claim 8.

* * * * *